United States Patent
Herman et al.

(10) Patent No.: US 10,861,629 B1
(45) Date of Patent: Dec. 8, 2020

(54) SOLID STATE DEPOSITION OF MAGNETIZABLE MATERIALS

(71) Applicant: Apple Inc., Cupertino, CA (US)

(72) Inventors: David S. Herman, San Francisco, CA (US); Simon Regis Louis Lancaster-Larocque, San Jose, CA (US); Shravan Bharadwaj, San Jose, CA (US)

(73) Assignee: Apple Inc., Cupertino, CA (US)

( * ) Notice: Subject to any disclaimer, the term of this patent is extended or adjusted under 35 U.S.C. 154(b) by 144 days.

(21) Appl. No.: 15/890,618

(22) Filed: Feb. 7, 2018

Related U.S. Application Data

(60) Provisional application No. 62/467,044, filed on Mar. 3, 2017.

(51) Int. Cl.

| | |
|---|---|
| *G06F 1/16* | (2006.01) |
| *H01F 13/00* | (2006.01) |
| *H01F 7/02* | (2006.01) |
| *C23C 4/08* | (2016.01) |
| *H01F 41/00* | (2006.01) |
| *H05K 5/02* | (2006.01) |

(52) U.S. Cl.
CPC ............. *H01F 13/003* (2013.01); *C23C 4/08* (2013.01); *G06F 1/1626* (2013.01); *H01F 7/02* (2013.01); *H01F 41/00* (2013.01); *H05K 5/0217* (2013.01)

(58) Field of Classification Search
CPC ................. H01F 7/0221; G06F 1/16–1/166
See application file for complete search history.

(56) References Cited

U.S. PATENT DOCUMENTS

| | | | |
|---|---|---|---|
| 4,769,624 A | * | 9/1988 | Merritt ............... H02K 1/17 335/302 |
| 6,500,498 B1 | | 12/2002 | Ford et al. |
| 6,773,765 B1 | | 8/2004 | Gambino et al. |
| 7,244,512 B2 | | 7/2007 | Ginder et al. |
| 8,536,098 B2 | | 9/2013 | Goyal |
| 2004/0115340 A1 | | 6/2004 | Griego |

FOREIGN PATENT DOCUMENTS

EP  144112 A1 *  6/1985

* cited by examiner

*Primary Examiner* — Ramon M Barrera
(74) *Attorney, Agent, or Firm* — Dickinson Wright RLLP

(57) ABSTRACT

Solid-state deposition of materials and structures formed thereof are described. In particular embodiments, solid-state deposition of materials may be utilized for integrated magnetic assemblies. The integrated magnetic assemblies may include a substrate having a cavity that is physically isolated from an environment external from the substrate and a magnetizable magnetic element formed of particles of magnetizable material. The magnetizable magnetic element may be carried within the cavity such that the magnetizable magnetic element fills the cavity and takes on a size and a shape of the cavity.

19 Claims, 18 Drawing Sheets

SOLID STATE DEPOSITION OF MAGNETIZABLE MATERIALS

CROSS-REFERENCE TO RELATED APPLICATIONS

The present application claims the benefit of U.S. Provisional Application No. 62/467,044, entitled "SOLID STATE DEPOSITION OF MAGNETIZABLE MATERIALS," filed Mar. 3, 2017, which is incorporated herein by reference in its entirety for all purposes.

FIELD

The described embodiments relate generally to solid-state deposition of magnetizable materials. More particularly, the embodiments relate to structures, devices, and accessories for electronic devices and computing devices that include integrated magnetizable materials formed by deposition.

BACKGROUND

Electronic devices incorporate a variety of electrical components that can each provide different functions. In the construction of electronic devices, the use of magnets is prevalent. Magnets, in particular permanent magnets, are typically implemented in various structures and design. At the same time, aesthetic is an increasingly important aspect of the user experience. The design, size, and construction of devices and accessories may be limited and even dependent on the size and structure of pre-shaped and pre-constructed magnets to be implemented in the devices and accessories. Conventional magnets in some embodiments do not provide for sufficient flexibility in order to achieve desired design aspects.

SUMMARY

Some embodiments of the present invention can include integrated magnetic assemblies. The integrated magnetic assemblies may include a substrate having a cavity that is physically isolated from an environment external from the substrate and a magnetizable magnetic element formed of particles of magnetizable material. The magnetizable magnetic element may be carried within the cavity such that the magnetizable magnetic element fills the cavity and takes on a size and a shape of the cavity.

Other embodiments include methods of integrating magnets in an assembly. The methods may include solid state depositing a magnetizable material on a material-receiving portion of a structure, shaping the deposited magnetizable material on the structure and magnetizing the deposited magnetizable material subsequent to the depositing.

Further embodiments include electronic devices. The electronic devices may include a housing including a recess, the housing formed of a first material and a unitary magnetic element comprising particles of a magnetizable material carried in the recess of the housing, the unitary magnetic element taking on a size and a shape of the recess. The electronic devices may also include a layer of second material positioned with respect to the unitary magnetic element, the layer of second material covering the recess such that the unitary magnetic element is enclosed within the housing.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
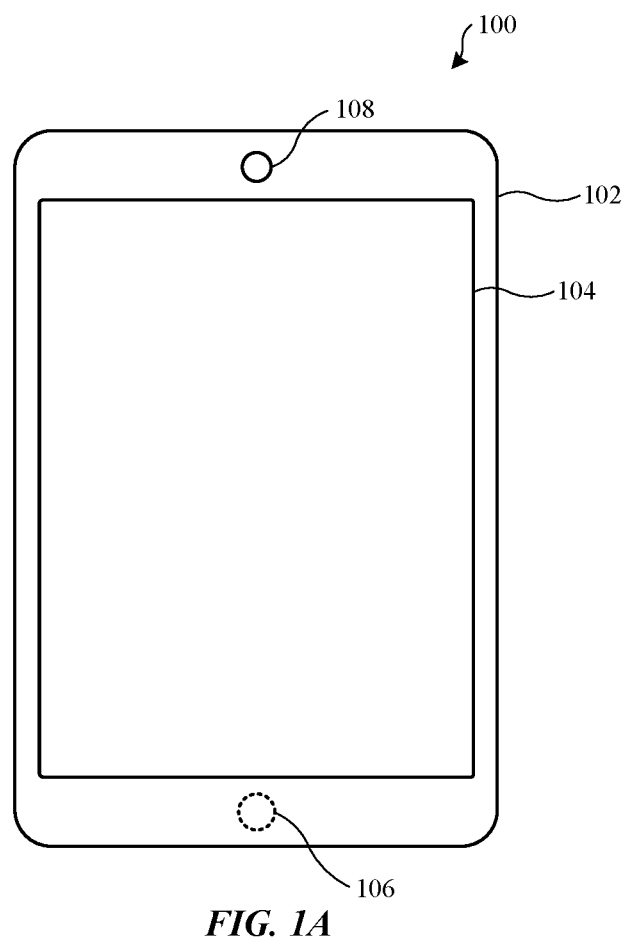
FIG. 1A illustrates an exemplary portable electronic device.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made without departing from the spirit and scope of the described embodiments.

Many electronic devices have been designed to be more compact while also increasing functionality of the computing devices. Computing devices have also been designed to provide an improved user experience.

Embodiments of the present invention include computer devices, such as tablets, laptops, cellular phones, smart phones, and other devices that may utilize magnets or magnetic assemblies.

The magnetic assemblies may include a structure, base, substrate, or bottom portion with material-receiving portions. Material, such as magnetizable material (along the lines of ferromagnetic material), may be deposited on the structure and into the material-receiving portions by solid-state deposition, including cold spray techniques, thermal spray techniques, laser assisted spray techniques, and others. The material or magnetic domains of the material may be aligned or directed during deposition by electromagnets, and heat may be regulated or transferred through the use of heat sinks such that the effects of heat during the solid-state deposition are lessened. The material may be formed, shaped, machined, or otherwise modified after it is deposited on the substrate and into the material-receiving portions. The material may also be encapsulated in the substrate or structure by placement of a top portion or cover over the material or deposition and formation of additional material over the structure. Further, masking may be used prior to and during deposition such that particular shapes may be constructed. Making may also be utilized to protect the deposited materials from the formation of oxide layers that may occur during deposition.

The material may be magnetized during deposition, after deposition, after shaping or machining, after encapsulation, and/or during other steps of the solid-state deposition and magnetic assembly formation processes. The materials may be magnetized to generate a magnetic field of a particular strength and direction. The magnetic material may have various shapes or gradient shapes, and may also include multiple portions that have been magnetized in different directions or according to different strengths. Furthermore, the material for deposition may be formed of various elements or particles to achieve desired properties, such as ductility.

Types of magnetic or magnetizable materials may include rare earth metals, such as Samarium-cobalt, Neodymium, Lanthanide-based, etc., ferromagnetic or ferromagnetic materials (e.g., iron-based), paramagnetic substances (e.g., platinum, aluminum, oxygen, etc.), diamagnetic materials, superconductors, etc. Other suitable magnetic materials which can be ground, reduced in size, fined, or otherwise utilized with the deposition techniques disclosed herein will be understood to those of skill in the art. The size of the magnetic or magnetizable materials may be configured or constructed to facilitate release from nozzles or other deposition devices used to deposit the magnetic materials. Magnetic or magnetizable materials or material candidates for magnetization other than those listed in this description may be used without departing from the invention disclosed herein.

These and other embodiments are discussed below with reference to FIGS. 1A-24; however, those skilled in the art will readily appreciate that the detailed description given herein with respect to these figures is for explanatory purposes only and should not be construed as limiting.

Figure 1B:
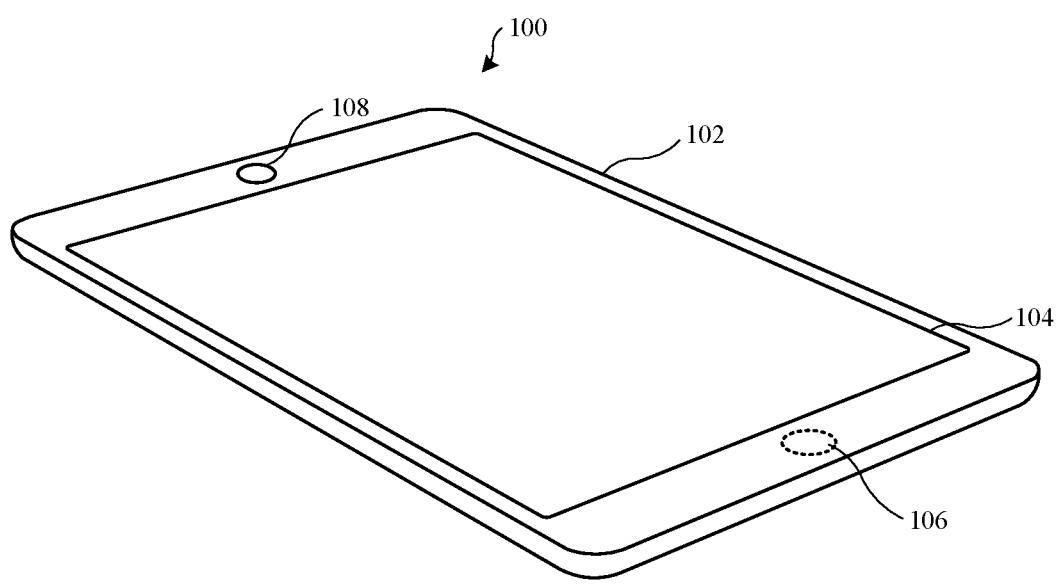
FIG. 1B illustrates a perspective view of an exemplary portable electronic device.

Turning first to FIGS. 1A and 1B, an exemplary electronic device 100 is illustrated in top plan and front perspective views. Electronic device 100 can be a tablet computing device, for example, although other similar types and varieties of electronic devices can also apply for the various disclosed components and features disclosed herein. For example, the various embodiments disclosed herein could also be used with a smart phone, a media playback device, a personal digital assistant, and a laptop computer, among other possible portable electronic devices. Portable electronic device 100 can include an outer housing 102, which can be adapted to hold a processor and other electronic components inside, and can also provide space for an exterior touchscreen or other display 104, one or more buttons, such as home button 106 and a camera 108, among other possible device components. The home button 106 may be virtual and may be optionally included with the electronic device 100. In embodiments where the device 100 is provided with a touch display or touch-screen, the display 104 may have touch capabilities well suited for receiving a touch event (and/or, in embodiments where the device 100 includes a haptic device, providing haptic feedback as a touch even), that can be used, for example, to control various operation of the electronic device if appropriately configured.

The use of magnets is prevalent in the market for electronic devices, such as device 100, other portable electronic devices, such as laptop computers, cellular telephones, watches, speakers, televisions, and the like. Magnets may also be used in accessory devices, such as cases, attachments, utensils, bands, etc. However, many drawbacks are associated with the use of magnets in, for example, manufacturing and design. Magnets, such as permanent magnets, are typically manufactured in predetermined shapes and sizes, and have been permanently magnetized before being implemented or integrated into electronic devices or accessories. Magnets often require discrete quantities and placements to achieve the desired magnetic effects. Thus, design and manufacturing decisions are often made in consideration of or entirely based on the limitations of shape, size, strength, and field distribution of the magnets.

Figure 2A:
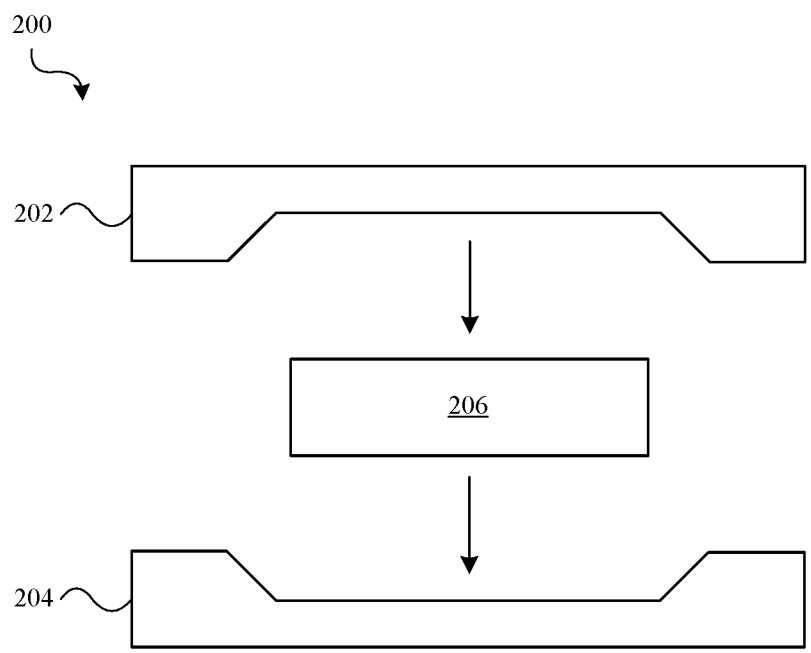
FIGS. 2A and 2B are side views illustrating a structure with a magnetic portion.
Figure 2B:
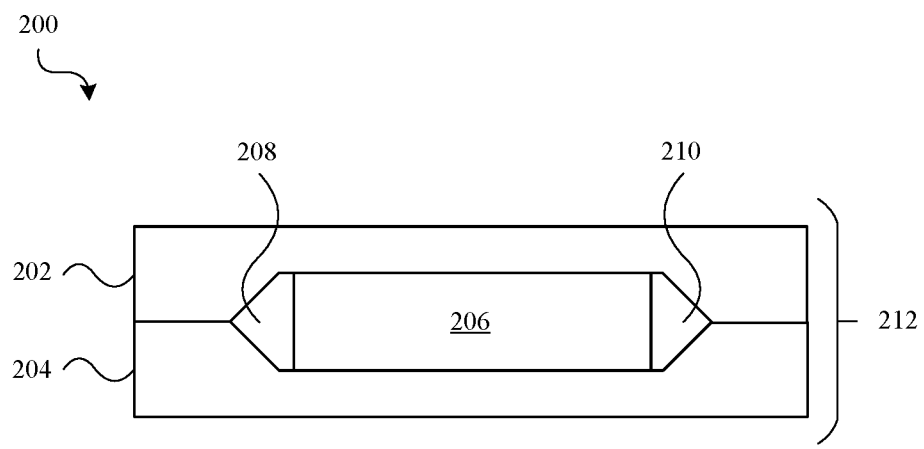

These and other example limitations are depicted in FIGS. 2A and 2B. FIG. 2A is an exploded side view of components of an electronic device 200, accessory device, and/or other magnet-utilizing device, and FIG. 2B is a compacted side view of the assembled device 200 of FIG. 2A. The device 200 may include a top portion 202, a bottom portion 204 and a magnet 206. The magnet 206 may be pre-sized and pre-magnetized. As assembled, the magnet 206 is enclosed within the device 200 between top portion 202 and bottom portion 204. The magnet 206 may alternatively be adhered to either the top portion 202, bottom portion 204, or both. Since the magnet 206 is pre-sized, the design and shape of the top portion 202 and bottom portion 204 are made based primarily on the magnet 206 and not other considerations, such as thickness, form factor, functionality, etc. Thus, in the example shown, the assembled device 200 may include unused gaps 208 and 210 between the portions 202, 204 and the magnet 206. The device 200 may also be of a thickness 212 that is disadvantageous or undesired (or both). The shortcomings of the device 200 shown in FIGS. 2A and 2B are predicated by the pre-sized and pre-magnetized magnet 206.

Therefore, alternative systems, devices, assembly methods, and processes for constructing integrated magnets for electronic devices and accessories are desired and disclosed herein.

As described herein, a structure of an assembly, device, and the like may refer to a structure, a bottom portion, a bottom layer, substrate, base, product, or other type of layer onto which magnetic or magnetizable material may be deposited and into which material-receiving portions may be formed. The deposited material as described herein may be magnetic material (e.g., material magnetized prior to deposition), non-magnetic material, magnetizable material (e.g., material that is non-magnetized and/or susceptible to magnetization such that the material may be magnetized during deposition or following deposition), and/or a combination thereof. The structures may be constructed of various materials described herein. The structures may have various sizes, shapes, and thicknesses (e.g., round, flat, mono-layer substrates, etc.). These terms may be used interchangeably and alternative uses of these like terms is not meant to limit or depart from the spirit of the invention disclosed herein.

Figure 3A:
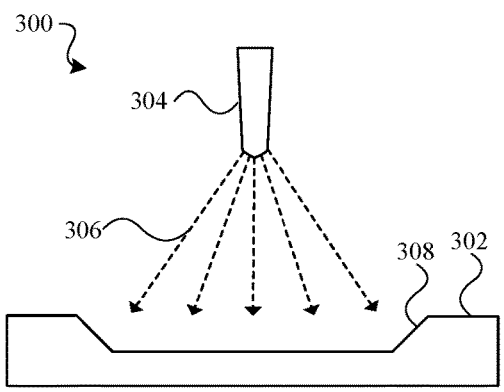
FIGS. 3A, 3B, 3C, 3D, 3E, and 3F are side views of a structure being assembled with an integrated magnetic material deposited.

FIG. 3A is a side view of a basic configuration 300 for constructing electronic devices, accessories, products, and the like according to examples of the invention. The device 300 may include a bottom portion or structure 302 that is formed of a non-magnetic material, a magnetic material, or of a combination of non-magnetic material and magnetic material. The bottom portion or structure 302 also includes a material-receiving portion 308. The material-receiving portion 308 may be formed by machining processes, shaping processes, and/or other suitable processes as will be understood to those of skill in the art from the disclosure herein. The material-receiving portion 308 as shown in the configuration 300 may be a divot, cavity, or other interior portion of reduced thickness with respect to the overall thickness of the bottom portion 302. The material-receiving portion 308 may be physically isolated from the environment external to the structure 302. Other suitable shapes of the material-receiving portion 308 are depicted throughout the disclosure herein, and further suitable shapes will be understood by those of skill in the art.

Positioned above (or otherwise with respect to) the bottom portion 302 is a nozzle 304 that is configured to spray or expel material 306 toward the bottom portion 302 (e.g., in the material-receiving portion 308). Although the material deposition is shown to be performed by spraying from a nozzle 304 in configuration 300, other material deposition techniques such as solid-state deposition are disclosed throughout. The material 306 may be a magnetic material. For example, the material may have magnetic properties and is grounded to a grain size fine enough to be sprayed or expelled by nozzle 304. Thus, the material 306 may be sprayed by the nozzle 304 into the material-receiving portion 308 of the bottom portion 302. In some embodiments, it may be desired to spray the material 306 to enter the material-receiving portion 308 and to also cover parts of the structure 302 outside of or external to the material-receiving portion 308.

Figure 3B:
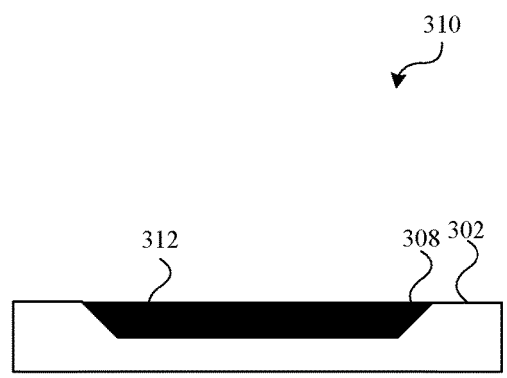

As shown in the configuration 310 of FIG. 3B, the material 306 may be deposited by the nozzle 304 to form a material layer 312 within the material-receiving portion 308 of the structure 302. The layer 312 as depicted is of a thickness such that the layer 312 does not exceed the upper surface of the bottom portion 302. The layer 312 shape and size may also be controlled during deposition of the material 306, as well as shaped or machined after deposition of the material 306, as is disclosed with reference to FIG. 5A and beyond. In configuration 310, the material-receiving portion 308 is shaped such that the material 306 may fall into or mold into the shape of the material-receiving portion 308 while being deposited and without machining. Therefore, the design, dimensions, and overall construction may not be dependent on the size and shape of a pre-formed permanent magnet, such as magnet 206 in device 200 of FIGS. 2A and 2B. When deposition is stopped or complete, the material 306 may extend above the material-receiving portion 308 and outside of the structure 302, although the layer 312 depicted in FIGS. 3B-3F has a flattened top surface for illustration purposes. In some embodiments, after the material 306 is deposited on structure 302, the configuration 310 may be cleaned, shaped, or otherwise prepared for additional assembly steps.

Figure 3C:
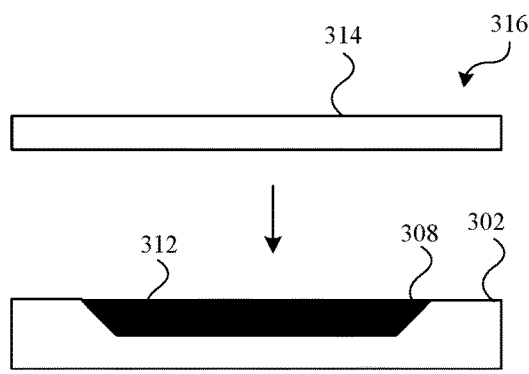
Figure 3D:
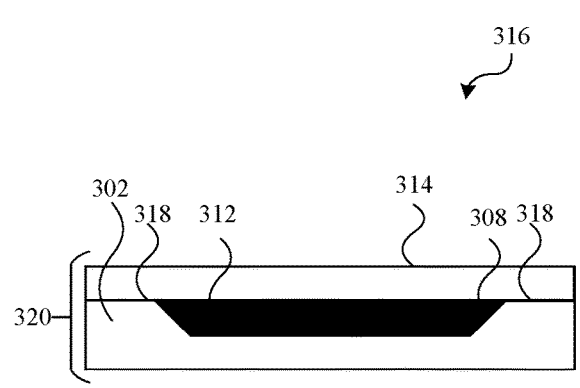

FIGS. 3C and 3D depict an assembly 316 being formed by steps following the deposition of material 306 in FIG. 3A and formation of the layer 312 in FIG. 3B. The layer 312 (and other layers described herein) may form a magnetic element which can be later magnetized or magnetized during deposition/prior to deposition. The assembly 316 is shown to be formed to encapsulate or enclose the layer of material 312 by positioning a top portion or cover 314 over the layer 312. The top portion or cover 314 may be positioned after the material layer 312 is formed, such that the material layer 312 is encapsulated within the assembly 316. The cover 314 may be pre-formed and/or constructed of the same or similar non-magnetic or partially magnetic material as the bottom portion or structure 302. When the cover 314 is placed over the material layer 312 and in contact with the structure 302, seams 318 may be formed at the positions of contact between the cover 314 and the structure 302 and layer 312. The cover 314 may be attached to the structure 302 to encapsulate the layer 312 by adhesives (e.g., adhesives positioned at the seams 318), magnetic coupling (not shown), or other attachment mechanism. As shown, the thickness 320 of the assembly 316 when formed is less than the thickness 212 of device 200.

Figure 3E:
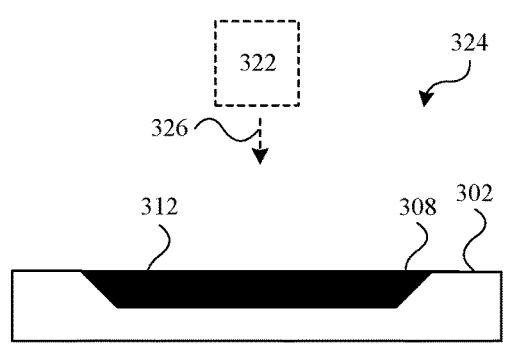
Figure 3F:
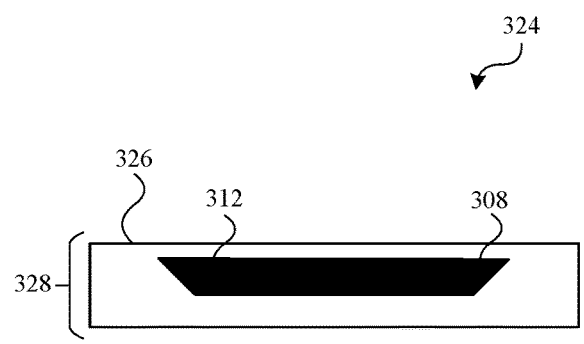

FIGS. 3E and 3F depict an assembly 324 being formed by steps following the deposition of material 306 in FIG. 3A and formation of the layer 312 in FIG. 3B. The assembly 324 is shown to be formed to encapsulate, embed, enclose or otherwise carry the layer of material 312 by depositing an enclosing material 326 from enclosing material source 322 over the layer 312. The enclosing material source 322 may be configured to deposit the enclosing material 326 over the layer 312 and structure 302. For example, the enclosing material 326 may include another magnetic material, material similar to the material of the structure 302, a thermoplastic, a thermoset plastic configured to set with the structure 302 formed on a similar thermoset plastic prior to the plastic being set (e.g., the thermosets being at temperatures above setting point), etc. In contrast to the assembly 316, the assembly 324 encloses the layer 312 in a seamless construction, thereby having (in some examples) an overall thickness 328 that is less than thickness 320 of assembly 316. The assembly 324 may be seamless in that both the structure 302 and the added material 326 are of the same material and thereby, when formed together, do not have a physical or visible seam, or border area, where the two materials were joined. The assembly 324 may also be seamless, although a different material may be used to encapsulate the layer 312, such that a border or area where the added material 326 is added to the structure 302 may be visible but not have a physical seam. Although the thicknesses 320 and 328 may vary with respect to each other, advantageously, these thicknesses may be less than that of thickness 212 of device 200. Furthermore, when compared to device 200, less space is utilized, less magnetic material may be consumed, the formation of gaps may be prevented, the shape of the magnetic may be customized, etc. Various other benefits and advantages of assemblies 316 and 324 are shown and described herein.

The magnetic materials, non-magnetic and partially magnetic geometric structures, formation processes, magnetization procedures, and devices/accessories are described in detail with reference to FIGS. 4A-24 below.

Referring next to FIGS. 4A-4D, side views of example structures with material-receiving portions are shown. The structures shown may be formed by machining or other shaping processes. The structures may be constructed of non-magnetic material or partially magnetic material. In some embodiments, the structures are formed of magnetic materials for utilization of particular magnetization properties as will be described below.

Figure 4A:
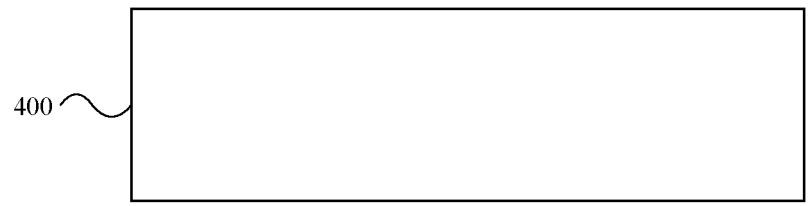
FIGS. 4A, 4B, 4C, and 4D are side views of examples structures used for constructing devices with integrated magnetic materials.

FIG. 4A shows an example material block 400 before being machined or shaped with structures. The material block 400 may be a slab or basic form of material that will be machined, shaped, altered, and the like as desired. The material block 400 may include non-magnetic material, magnetic material, plastic material (e.g., thermoplastics, non-set thermo set plastic, set plastic, etc.), other metal material, and/or any combination of viable materials suitable for machining and magnetic integration as will be understood by those of skill in the art from the disclosure herein.

Figure 4B:
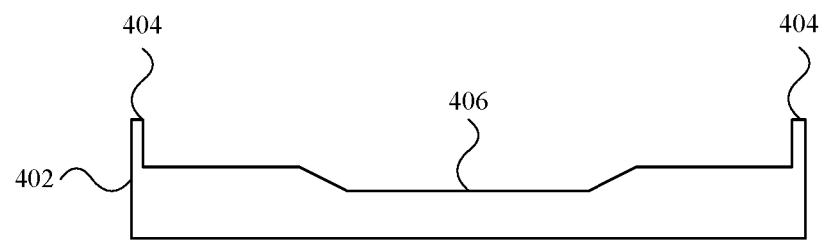
Figure 4C:
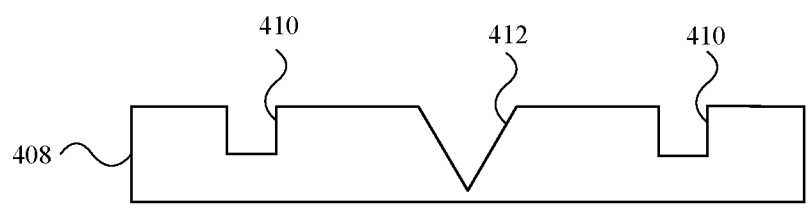
Figure 4D:
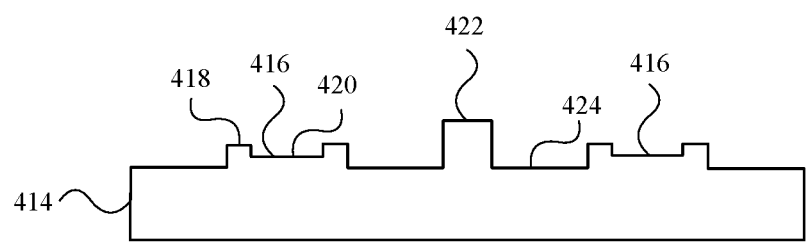

In FIG. 4B, the material block (e.g., block 400) is machined or shaped into a structure 402. The structure 402 may include edges 404 as well as a material-receiving portion 406 that is of a thickness less than the rest of the structure 402. The material-receiving portion 406 may be defined by the deepest portion in the structure 402 or the entire area between the edges 404. FIG. 4C is an example machined/shaped structure 408 that includes various material-receiving portions 410 and 412. The structure 408 may include square-shaped material-receiving portions 410 and a cone-shaped material-receiving portion 412. The material-receiving portions 410 and 412 are shown to have various thicknesses. FIG. 4D is an example machined/shaped structure 414 where the structure 414 is shaped to have areas of varying heights. Sections 416 as shown include edges 418 of increased height, thereby forming a recessed portion 420 between the edges 418, such that the recessed portion 420 may act as a material-receiving portion. A protrusion 422 may be formed near the center (or other section) of the structure 414 between the sections 416, and may extend to a height greater than that of the sections 416. The arrangement of the protrusion 422 being between the sections 416 forms walled portions 424 on both sides of the protrusion 422. The walled portions 424 are, in effect, sectioned by the sides of the protrusion 422 and the edges 418 of the sections 416 and thereby may act as material-receiving portions.

Deposition of materials may be performed in various ways. The material (e.g., magnetic material, magnetizable material, etc.) may be ground into fine enough particles such that it can be deposited by spraying. Cold spraying techniques as well as thermal spraying techniques (or a hybrid of cold and thermal spraying techniques) and flame spray techniques may be utilized for depositing material (e.g., solid-state deposition). Other deposition techniques may be utilized that achieve additive magnet or material layering on substrates or structures. The magnetic material may be deposited in inert atmospheres to facilitate accurate deposition (e.g., nitrogen atmosphere, argon atmosphere, etc.). Laser inducing techniques may be utilized as well, such as coaxial laser assisted deposition for local heating and relatively fast cooling. Any combination of the techniques listed herein may be utilized for material deposition, and these techniques listed are not exclusive. Advantageously, the deposition techniques may be implemented to prevent or otherwise reduce the formation of an oxide layer during deposition and/or prior to magnetization, thereby increasing the efficiency of the formation process as well as the quality of the devices or magnets being produced. The deposition technique may be selected based on the type of material being used, type of atmosphere available, type of device or accessory being made, etc. Those of skill in the art will understand additional techniques outside of those listed for deposition may be utilized without departing from the invention disclosed herein.

Figure 5A:
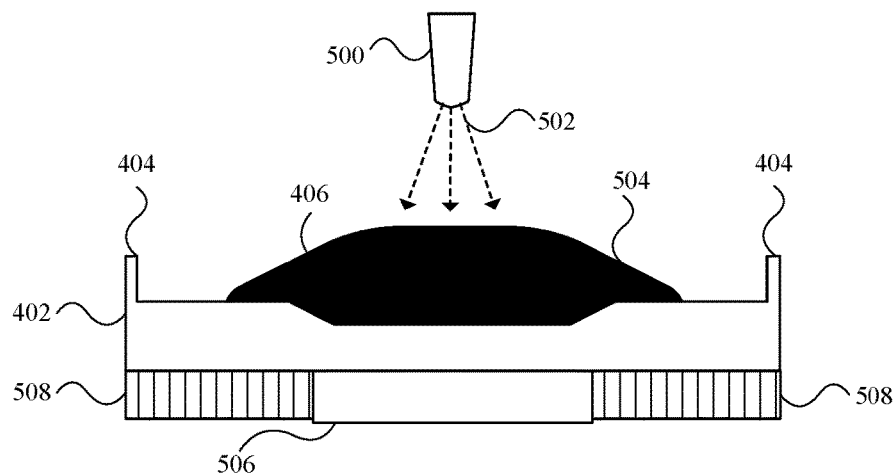
FIGS. 5A, 5B, and 5C show deposition of magnetizable materials on various structures and material-receiving portions of the structures.
Figure 5B:
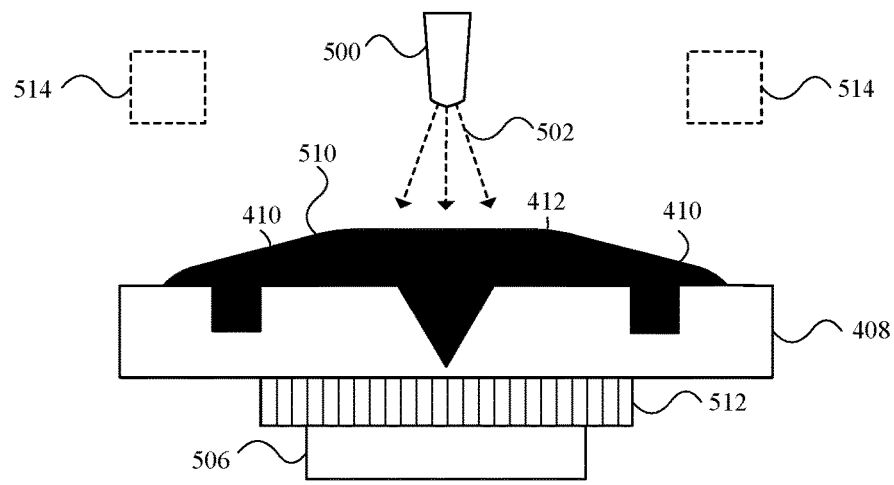
Figure 5C:
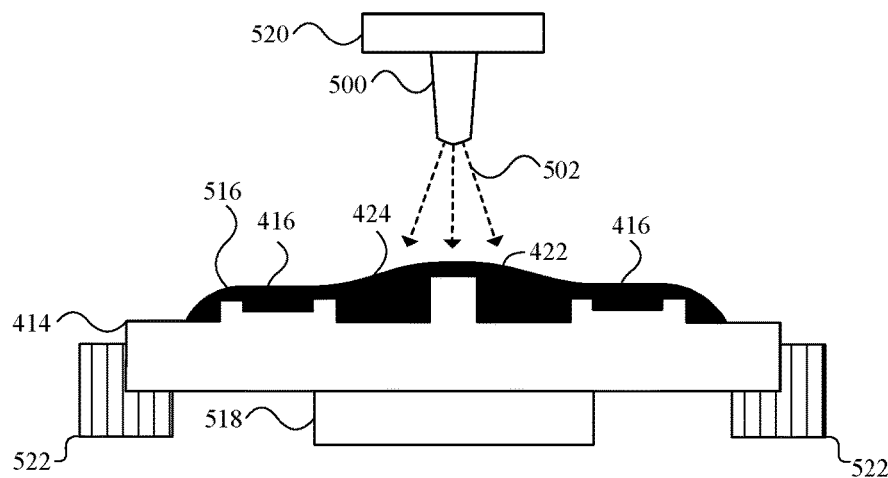

Referring next to FIGS. 5A-5C, side views of material deposition on the structures shown in FIGS. 4B-4D are shown. In FIG. 5A, material deposition on the geometric structure 402 from FIG. 4B is shown. The structure 402 includes the edges 404 and the material-receiving portion 406. In FIG. 5B, material deposition on the geometric structure 408 from FIG. 4C is shown. The structure 408 includes the square-shaped material-receiving portions 410 and the cone-shaped material-receiving portion 412. In FIG. 5C, material deposition on the geometric structure 414 is shown. The structure 414 includes the protrusion 422 and sections 416 as described above, which form material-receiving portions 406.

A nozzle 500 is positioned above the structures 402, 408, and 414 to deposit material 502 over the structures 402, 408, 414 and into the respective material-receiving portions. The material deposition creates material layers 504, 510, and 516. Although the structures show material-receiving portions, the deposition of material may not result in an even deposition or deposition only in the material-receiving portions. For example, the material layers 504, 510, and 516 have varying thicknesses and extends to areas outside of the material-receiving portions. Further, the layers 504, 510, and 516 as shown have not been shaped or machined, such that the layers may not have a preconfigured shape. In some embodiments, the material 502 being deposited is not permanently magnetized during deposition, and may be magnetized following deposition as is described below, such that the strength, direction, and other aspects of the material when magnetized can be customized.

As shown in FIGS. 5A and 5B, associated with or coupled to the structures may be an electromagnet 506. In addition, FIG. 5B includes electromagnets 514 optionally positioned above the structure 408 and generally in line with the nozzle 500. In another embodiment as shown in FIG. 5C, an electromagnet 518 may be positioned below the structure 414 and an electromagnet 520 may be positioned above the nozzle 500. As described above, the material 502 may be a magnetic material having magnetic characteristics (e.g., polarity, strength, etc.) that can be manipulated during deposition to align the material 502 in a particular shape or configuration, or to align/arrange the material 502 according to alignment of magnetic fields. The electromagnets may be configured, positioned, etc., for alignment of magnetic domains of the material being deposited and, thus, electromagnets may be configured to direct or guide the magnetic material 502 during deposition such that the magnetic material 502 is constricted to or directed to particular locations or forms particular shapes/layers. In some embodiments, the electromagnets act as a magnetic lens to direct the amount and location to which material 502 is deposited. For example, the electromagnets may act as a magnetic lens by generating a magnetic field directed toward the nozzle 500 or outer area of the nozzle 500 where the material 502 is expelled/deposited. The magnetic field from the electromagnets may constrict the material 502 exiting the nozzle 500 in a particular direction and in a dispersion of particular thickness (e.g., constricting the radius of the dispersion amount) such that an amount and location of the material 502 deposited may be customized. Although the embodiments depict electromagnets attached to the structures or nozzles being implemented to generate magnetic fields during deposition, electromagnets may be attached to other portions structures, and other examples may not require the presence of such electromagnets. For instance, deposition of material 502 may occur within a magnetic field being generated by an outside source not attached to the structures, nozzles, or other components used for deposition, and such magnetic fields can align or arrange deposition of the material 502 on the structures as desired. Further, deposition of material may be performed on a substrate that is moving during deposition within an electromagnetic field to achieve a desired arrangement or alignment of the deposited materials.

Additionally, coupled to or associated with the structures is a heat sink for reducing effects of heat during the deposition processes and/or further processes described herein. The heat sink may be implemented in various positions. For example, in FIG. 5A, the heat sink 508 is positioned to surround the electromagnet 506 and is otherwise coupled to a bottom surface of the structure 402. In FIG. 5B, the heat sink 512 is coupled to a bottom surface of the structure 408 and a top surface of the electromagnet 506 (e.g., the heat sink 512 is positioned between the structure/substrate 408 and the electromagnet 506). In FIG. 5C a heat sink 522 is positioned at the edges of the structure 414 and coupled to the side and bottom of the structure 414. The positions of heat sinks depicted are exemplary and not exclusive. Those of skill in the art will understand other suitable positions for heat sinks from the disclosure herein. The heat sinks may be high capacity heat sinks and may be constructed of multiple heat sinks strategically positioned for the transfer of heat. In embodiments where the material is deposited through thermal spraying or hybrid cold/thermal spraying techniques (and/or other technique where heat is utilized or may be a factor), the heat sinks may be employed to dissipate the heat from the structures, thereby reducing the effects of heat on the structures during material deposition. Dissipation of heat during deposition of materials may be utilized, for example, in assemblies where the structures/substrates are sensitive to the heat generated and/or the shape of the structures/substrates (or the deposited material) may be altered due to exposure to heat (e.g., in examples where the structures are thermoplastics, thermosets, or other materials with relatively low melting point temperatures).

Figure 6A:
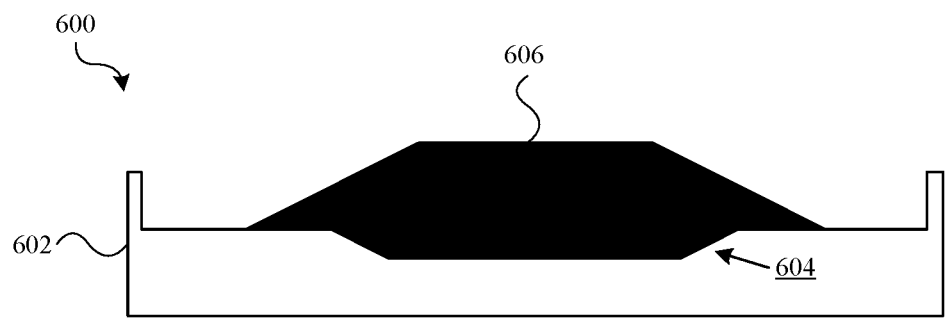
FIGS. 6A, 6B, 6C, and 6D depict shaping and encapsulation/integration of magnetizable materials in a structure with a material-receiving portion.
Figure 6B:
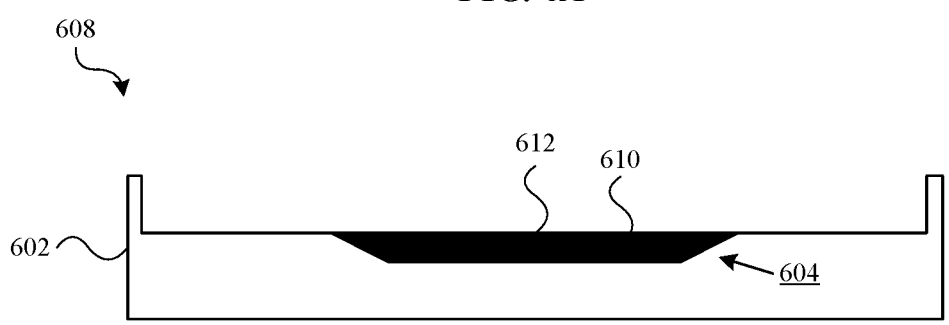

Referring next to FIGS. 6A-6D, examples of machining, shaping, and encapsulating with respect to substrate/structure 602 are shown. The structure 602 may be similar to the structure 402 of FIGS. 4B and 5B. In FIG. 6A, the assembly 600 includes a substrate 602 that has a material-receiving portion 604. Material has been deposited on the substrate 602 (e.g., in the shape of material 504 from FIG. 5A) and the material is shaped or machined into shaped layer 606. A machining and shaping process may be utilized to remove the portions of material to form the shaped layer 606. Alternatively, electromagnets may have been utilized to manipulate the alignment/arrangement of the materials during deposition such that the shaped layer 606 was formed without machining or other shaping operations. In FIG. 6B, a machined assembly 608 (e.g., machined from assembly 600) is shown. The assembly 608 includes substrate 602 with a material-receiving portion 604. The shaped layer 606 from assembly 600 has been further machined to form flat layer 610. The flat material layer 610 includes a flat top surface 612 and is shaped to fill the material-receiving portion 604.

Figure 6C:
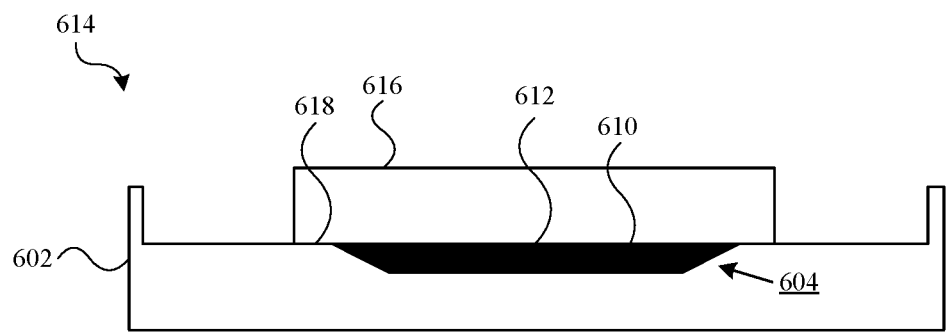
Figure 6D:
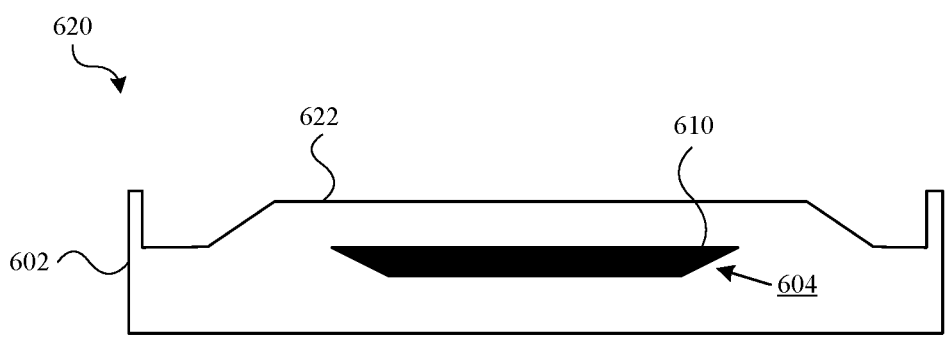

In FIG. 6C, a further developed assembly 614 from the machined assembly 608 is shown. The flat material layer 610 in assembly 614 may be covered by a top portion cover 616, thereby encapsulating the material layer 610 within the structure 602. In this example, the cover 616 is configured to cover the entire flat surface 612 of flat material layer 610. The cover 616 may be formed prior to attachment, such that positioning the cover 616 over the material layer 610 leaves seams 618 from the attachment. The cover 616 may be adhered to the substrate 602 to encapsulate the flat material layer 610 by adhesives, magnetic coupling, etc. In an alternative embodiment, FIG. 6D shows a further developed assembly 620 from assembly 608. Assembly 620 differs from assembly 614 in that a cover is not positioned over the material layer 610, but rather, an additional encapsulating material 622 is deposited over the material layer 610 to form a uniform, seamless encapsulation. The additional material 622 may be of a same or similar material to that of the substrate 602. The material 622 may be attached to the substrate 602 seamlessly by a heating process (e.g., the material 622 and substrate 602 may be a thermoplastic material or other un-set material which can be molded and shaped with the newly deposited material 622).

Figure 7A:
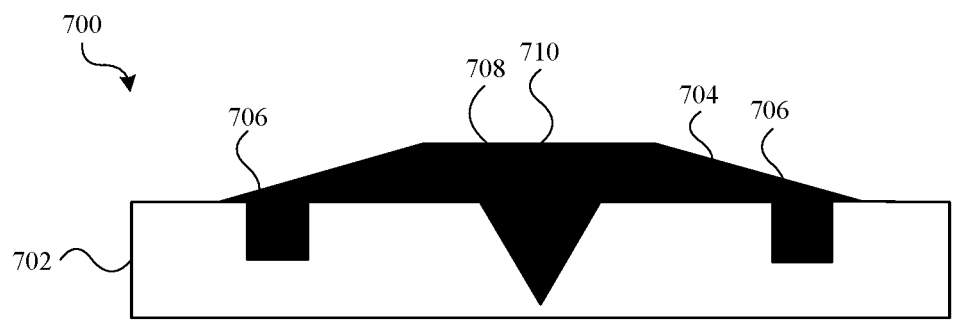
FIGS. 7A, 7B, 7C, and 7D depict shaping and encapsulation/integration of magnetizable materials in a structure with a plurality of material-receiving portions.
Figure 7B:
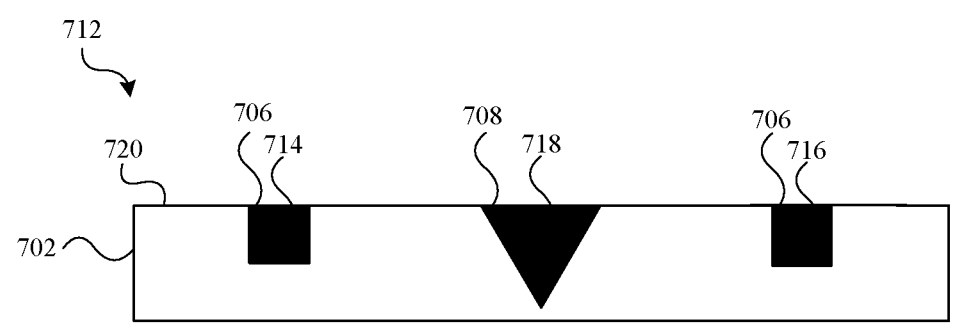

Referring next to FIGS. 7A-7D, examples of machining, shaping, and encapsulating with respect to substrate/structure 702 are shown. The substrate 702 may be similar to the substrate 408 shown in FIG. 4C and FIG. 5B. In FIG. 7A, the assembly 700 includes a substrate 702 that has square-shaped material-receiving portions 706 and a cone-shaped material-receiving portion 708. Material 704 has been deposited on the substrate 702 (e.g., in the shape of material 510 from FIG. 5B) and the material is shaped or machined into shaped layer 710. A machining and shaping process may be utilized to remove the portions of material to form the shaped layer 710. Alternatively, electromagnets may have been utilized to manipulate the alignment/arrangement of the materials during deposition such that the shaped layer 710 was formed without machining or other shaping operations. In FIG. 7B, a machined assembly 712 (e.g., machined from assembly 700) is shown. The assembly 712 includes substrate 702 with square-shaped material-receiving portions 706 and a cone-shaped material-receiving portion 708. The shaped layer 710 from assembly 700 has been further machined to remove material above the top surface of the substrate 702. As a result, three separate material depositions are formed in the structure 702. Square shaped material depositions 714 and 716 are formed within the square material-receiving portions 706 and a cone-shaped material deposition 718 is formed within the cone-shaped material-receiving portion 708.

Figure 7C:
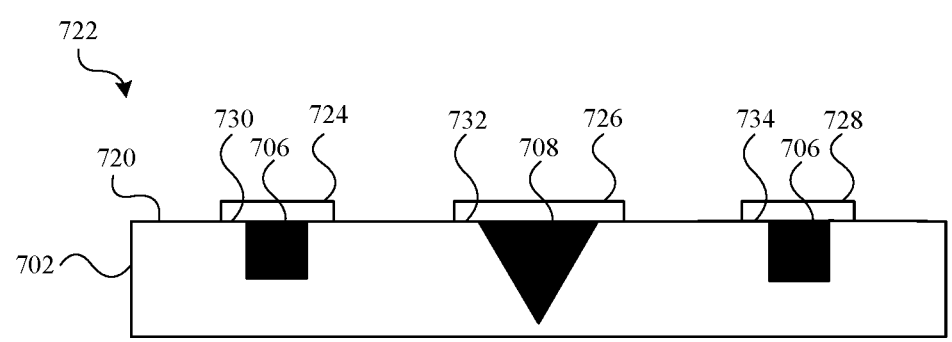
Figure 7D:
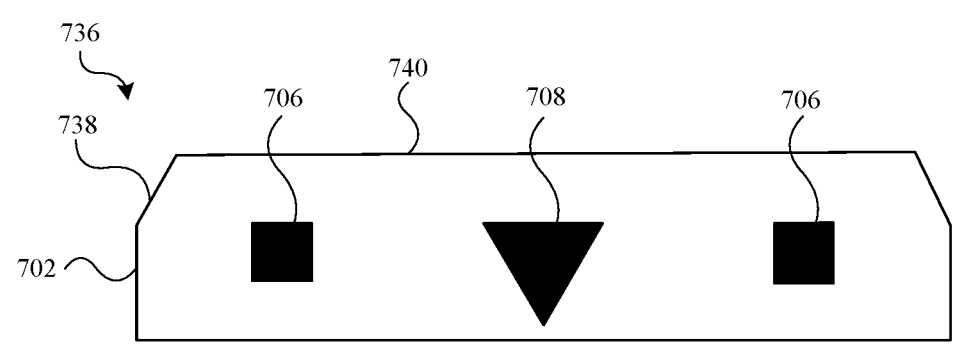

In FIG. 7C, a further developed assembly 722 from the machined assembly 712 is shown. A cover may be placed on the top surface 720 of the substrate 702, or, as shown, multiple covers 724, 726, and 728 may be placed over each of the material-receiving portions 706 and 708. In such embodiments, the covers may form seams. For example, cover 724 may form a seam 730, cover 726 may form seam 732, and cover 728 may form seam 734. The covers 724, 726, and 728 may be adhered to the substrate 702 to encapsulate the shaped material depositions 714, 716, and 718 by adhesives, magnetic coupling, etc. In an alternative embodiment, FIG. 7D shows a further developed assembly 736 from assembly 712. Assembly 736 differs from assembly 722 in that a cover is not positioned over the material depositions, but rather, an additional encapsulating material 738 is deposited over the material-receiving portions 706 and 708 to form a uniform, seamless encapsulation from the bottom of the substrate 702 to the top surface 740 of the encapsulation material 738. The additional material 738 may be of a same or similar material to that of the substrate 702. The material 738 may be attached to the substrate 702 seamlessly by a heating process (e.g., the material 738 and substrate 702 may be a thermoplastic material or other un-set material which can be molded and shaped with the newly deposited material 702).

Figure 8A:
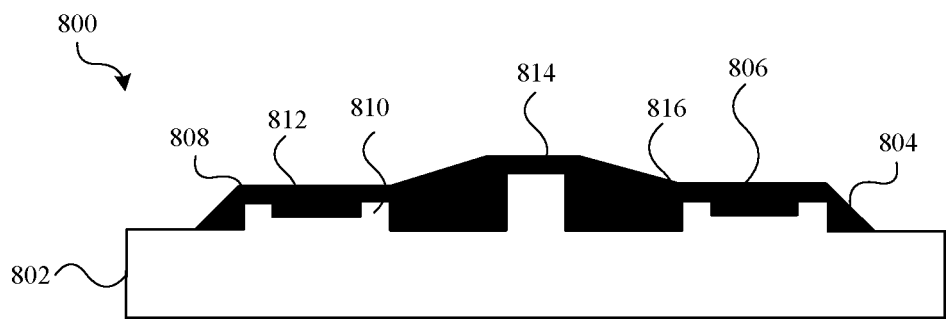
FIGS. 8A, 8B, 8C, and 8D depict shaping and encapsulation/integration of magnetizable materials in various structures having material-receiving portions.
Figure 8B:
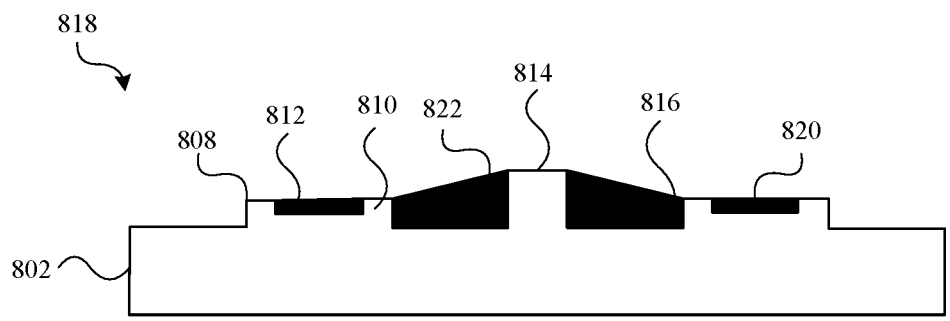

Next, in FIGS. 8A-8D, examples of machining, shaping, and encapsulating with respect to substrate/structure 802 are shown. The substrate 802 may be similar to the substrate 414 shown in FIG. 4D and FIG. 5C. In FIG. 8A, the assembly 800 includes a substrate 802 that has sections 808 including edges 810 and recessed portions 812 formed between the edges 810, a protrusion 814, and walled portions 816 that may act as material-receiving portions. Material 804 has been deposited on the substrate 802 (e.g., in the shape of material 516 from FIG. 5C) and the material is shaped or machined into shaped layer 806. A machining and shaping process may be utilized to remove the portions of material to form the shaped layer 806. Alternatively, electromagnets may have been utilized to manipulate the alignment/arrangement of the materials during deposition such that the shaped layer 806 was formed without machining or other shaping operations. In FIG. 8B, a machined assembly 818 (e.g., machined from assembly 800) is shown. The assembly 818 includes substrate 802 with the sections 808, protrusion 814 and walled portions 816. The shaped layer 806 from assembly 800 has been further machined to remove material above the top surface of the substrate 802. Further, material has been removed along the top of sections 808 and extending from sections 808 to the top of the protrusion 814. As a result, four separate material depositions are formed in the structure 802. Material depositions 820 are formed within the structures 808 and material depositions 822 are formed in the walled portions 816.

Figure 8C:
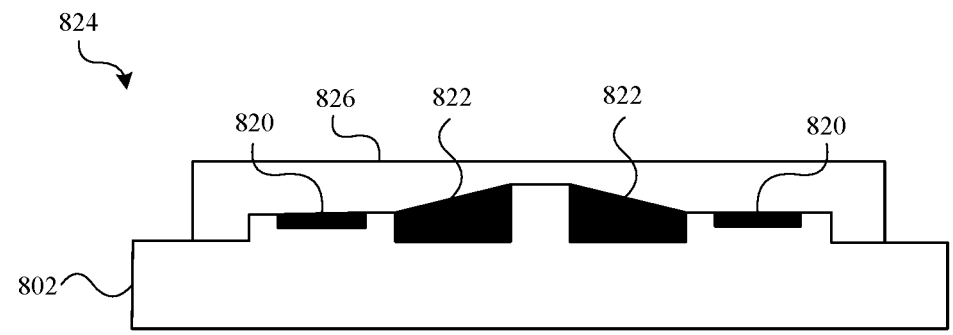
Figure 8D:
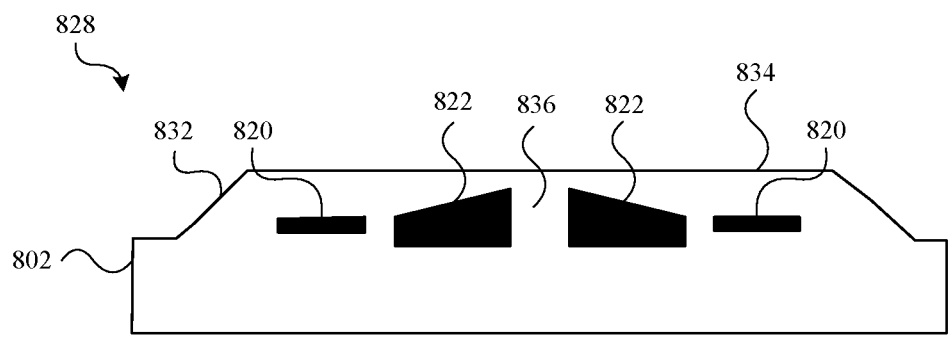

In FIG. 8C, a further developed assembly 824 from the machined assembly 818 is shown. A cover 826 may be placed over the substrate 802. In such embodiments, the cover 826 may form seams between the sections, protrusions, and material depositions 820 and 822 in the structure 802. The cover 826 may be adhered to the substrate 802 by adhesives, magnetic coupling, etc. In an alternative embodiment, FIG. 8D shows a further developed assembly 828 from assembly 818. Assembly 828 differs from assembly 824 in that a cover 826 is not positioned over the material depositions, but rather, an additional encapsulating material 832 is deposited over the material-receiving portions 812 and 816 to form a uniform, seamless encapsulation from the bottom of the substrate 802 to the top surface 834 of the encapsulation material 832. Separations may be formed by encapsulation from the structures previously machined. For example, the protrusion 814, after seamless encapsulation, forms a separation 836 between material depositions, such as depositions 822. The additional material 832 may be of a same or similar material to that of the substrate 802. The material 832 may be attached to the substrate 802 seamlessly by a heating process (e.g., the material 832 and substrate 802 may be a thermoplastic material or other un-set material which can be molded and shaped with the newly deposited material 832).

Advantageously, a desired shape, design and construction of the structures 602, 702, and 802 may be manufactured as desired and not restricted by the shape of pre-sized or pre-magnetized magnets. In addition, the top material or covers may be additionally shaped before, during, and/or after positioning, deposition, and/or encapsulation. Furthermore, the excess material that is machined from the material layers may be recycled and used in later deposition processes. This also provides the benefit of efficient utilization of materials, such as examples where rare-earth magnetic materials are used. Low amounts may be used and extras that are deposited may be removed and used in later processes.

Figure 9:
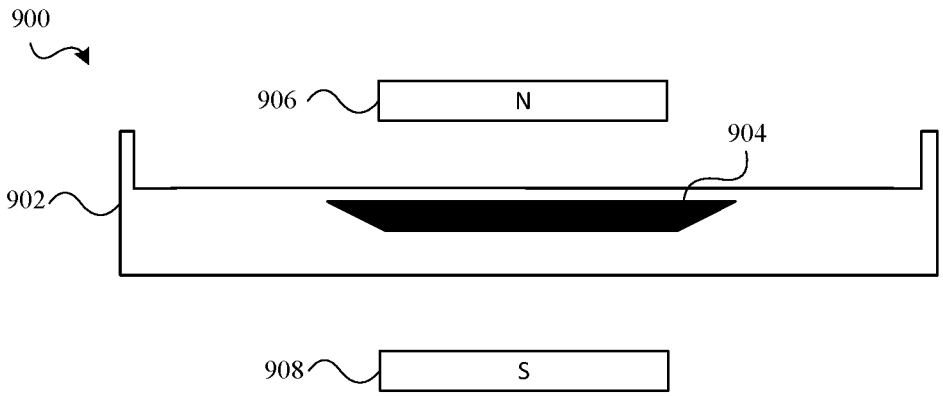
FIG. 9 is a side view showing magnetization of example integrated magnetizable materials in structures depicted at FIGS. 6A-6D.
Figure 10:
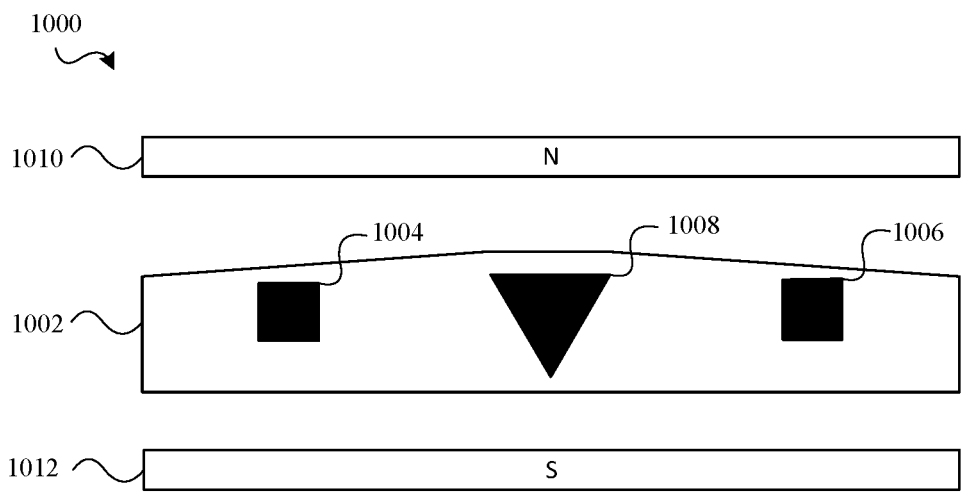
FIG. 10 is a side view showing magnetization of example integrated magnetizable materials in structures depicted at FIGS. 7A-7D.
Figure 11:
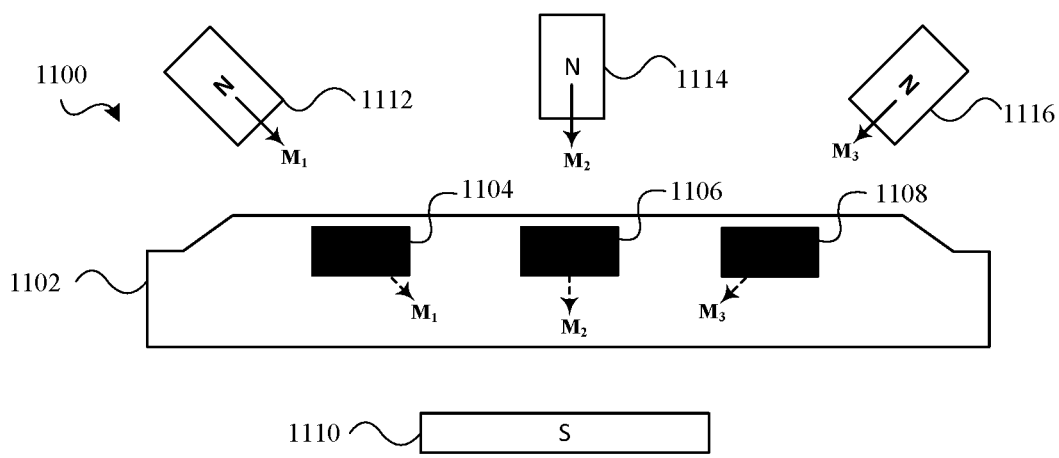
FIG. 11 is a side view showing magnetization of integrated magnetizable materials in structures depicted at FIGS. 8A-8D.

FIGS. 9, 10 and 11 are side views of the previously formed structures in FIGS. 6D, 7D, and 8D, but additionally showing the step of magnetization. The structures from FIGS. 6D, 7D, and 8D are shown as examples, and the magnetization process may be utilized in other structures depicted or potentially formed by the invention disclosed herein. Furthermore, although the magnetization process is shown in FIGS. 9-11 after material deposition, machining, shaping, and encapsulation, the magnetization may occur prior to any of those steps. For example, magnetization may occur during material deposition and/or prior to or during any of the other steps. In some embodiments, the magnetic material that is deposited is not magnetized. Advantageously, this allows for the shape of the magnet to be customized prior to the formation of the permanent magnet. In configuration 900, the structure 902 includes the integrated magnet 904. Poles of a magnetic device (e.g., the north pole 906 and south pole 908) are positioned above and below the integrated magnet 904 to conduct the magnetization in a desired alignment, orientation and strength.

Similarly, in configuration 1000 of FIG. 10, the structure 1002 includes integrated magnets 1004, 1006, and 1008. A magnetic device is positioned such that a north magnetic pole 1010 is positioned above the structure 1002 while the south magnetic pole 1012 is positioned below the structure 1002. These poles are aligned such that the magnetic field generated by the magnetic device will magnetize the integrated magnets 1004, 1006, and 1008 to generate a magnetic field of similar strength and direction.

Lastly, in configuration 1100 of FIG. 11, the structure 1102 includes integrated magnets 1104, 1106, and 1108. Multiple magnetic devices may be positioned to achieve a particular magnetized direction of the integrated magnets 1104, 1106 and 1108. For example, the north poles 1112, 1114, and 1116 are positioned across from magnets 1104, 1106, and 1108 respectively and the south pole 1110 to magnetize the integrated magnets 1104, 1106, and 1108 with varying directions with respect to each other. For example, magnet 1112 may induce a magnetic field in magnet 1104 along the direction of magnetic field M1, magnet 1114 may induce a magnetic field in magnet 1106 along the direction of magnetic field M2, and magnet 1116 may induce a magnetic field in magnet 1108 along the direction of magnet field M3. In alternative embodiments, multiple north poles and south poles are used for the magnetization, and the positions of the poles may be swapped as opposed to what is depicted. Further, magnets of varying strengths may be used for magnetization, thereby magnetizing magnets to generate magnetic fields of various strengths as desired.

Figure 12:
FIG. 12 is a side view of a device attached to an accessory, the device and accessory having integrated magnetics formed from deposited magnetizable material.
Figure 13:
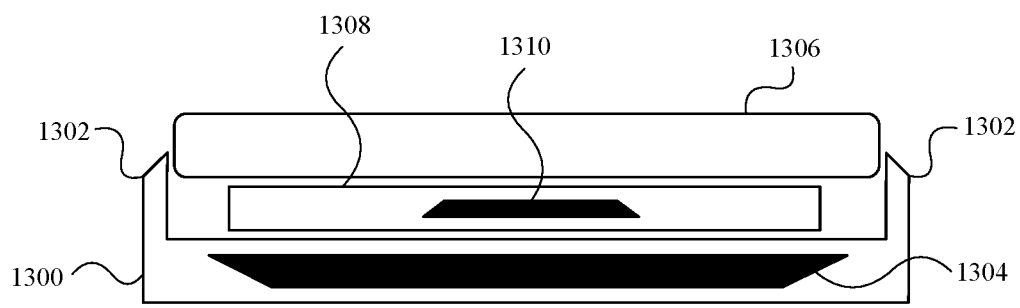
FIG. 13 is a side view of a device attached to an accessory via an adapter, the adapter and accessory having integrated magnets formed from deposited magnetizable material.
Figure 14:
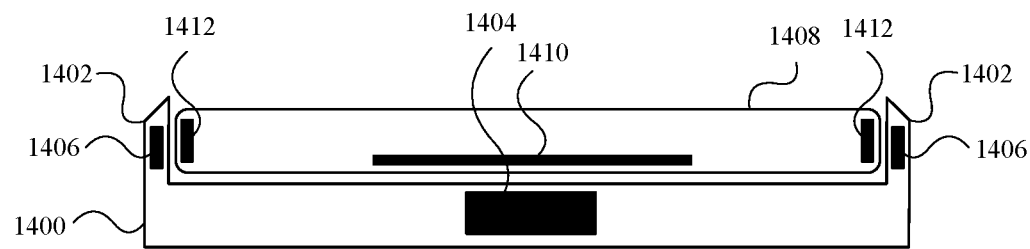
FIG. 14 is a side view of a device attached to an accessory with edges, the device and the edges of the accessory having integrated magnets formed from deposited magnetizable material.

FIGS. 12-14 are side views showing an electronic device and an accessory with an integrated magnet. The accessories and devices shown in FIGS. 12-14 may be utilized in relationship to each other. In some embodiments, the accessory may be a case for the device, a mount for the device, and/or other type of attachment for the device. Alternatively, the accessory may be a manufacturing accessory. For example, the accessory may be a frame for a touch device into which the device is to be assembled. The accessory may also include products such as keyboards, controllers, cable connectors, screens, etc., through which a device may interact and function by magnetic connection, magnetic interface, or other magnetic connection.

In FIG. 12, an electronic device 1206 (e.g., tablet, phone, etc.) is positioned within an accessory 1200. The accessory 1200 includes edges 1202 to act as a boundary to the electronic device 1206. In some embodiments, the accessory 1200 is formed similar to the structures described above. The accessory 1200 includes an integrated magnet 1204 which may be formed and integrated according to the methods and processes described above. Further, the device 1206 also includes an integrated magnet 1208. The magnet 1204 and magnet 1208 may be magnetized after integration such that the magnets 1204 and 1208 are attractive, thereby forming a magnetic connection between the accessory 1200 and device 1206, securing the device 1206 in the accessory 1200 magnetically.

FIG. 13 is a side view of a similar embodiment to FIG. 12. FIG. 13 includes an accessory 1300 and an electronic device 1306. However, FIG. 13 also includes an adapter 1308 (e.g., a universal adapter) which may be utilized to facilitate attachment between the accessory 1300 and the device 1306. The accessory 1300 includes edges 1302 to act as a boundary to the device 1306. The accessory 1300 also includes an integrated magnet 1304 such that the accessory 1300 may be formed similar to the structures described above. The adapter 1308 also includes an integrated magnet 1310. The magnet 1304 and the magnet 1310 may be magnetized such that the magnets are attractive, forming a magnetic connection. The adapter 1308 may be attached to the device 1306 via another attachment mechanism (not shown), such as an adhesive, another magnet, a mounting device, etc.

FIG. 14 is a side view of another embodiment of an accessory and an electronic device utilizing integrated magnets. The accessory 1400 includes edges 1402 that act as a boundary to the device 1408. The accessory 1400 includes an integrated magnet 1404, such that the accessory 1400 may be formed as a structure as described above. Positioned at the edges 1402 of the accessory may also be an additional set of integrated magnets 1406. The device 1408 may include an integrated magnet 1410 (formed as those formed with the structure described above). The integrated magnet 1410 may alternatively be positioned exterior to the device 1408. The magnet 1410 may be magnetized to attract to the integrated magnet 1404 of the accessory 1400 such that a magnetic coupling is formed between the device 1408 and the accessory 1400 when the device 1408 is positioned within the vicinity of the accessory 1400. The device 1408 may also include magnets 1412 integrated or positioned exterior to the outer portions of the device 1408. The magnets 1412 may be magnetized to attract to the magnets 1406 in the edges 1402 of the accessory 1400 such that a magnetic coupling is formed between magnets 1412 and magnets 1406 when the device 1408 is in the vicinity of the accessory 1400.

Figure 15A:
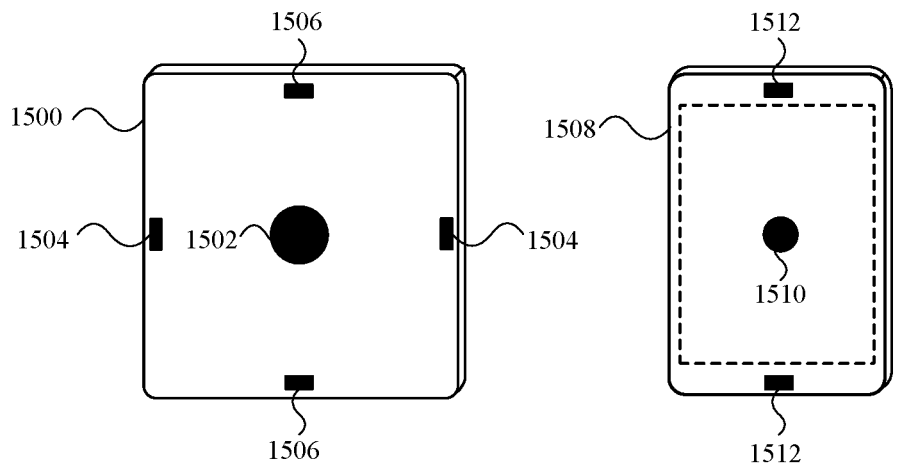
FIGS. 15A, 15B, and 15C show electronic devices and attachment accessories in various orientations with deposited magnetic materials and integrated magnets.
Figure 15B:
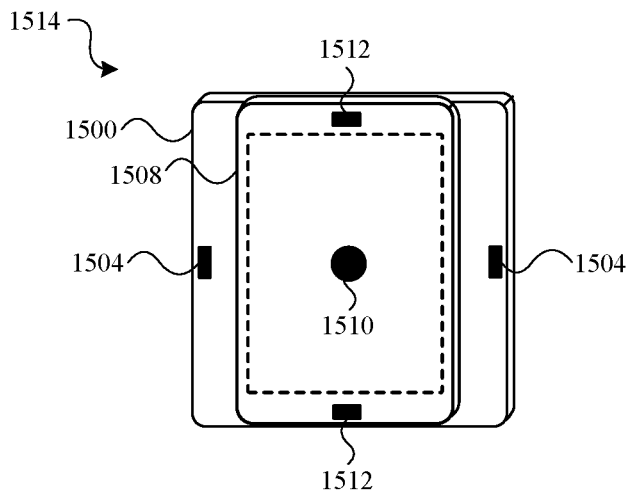
Figure 15C:
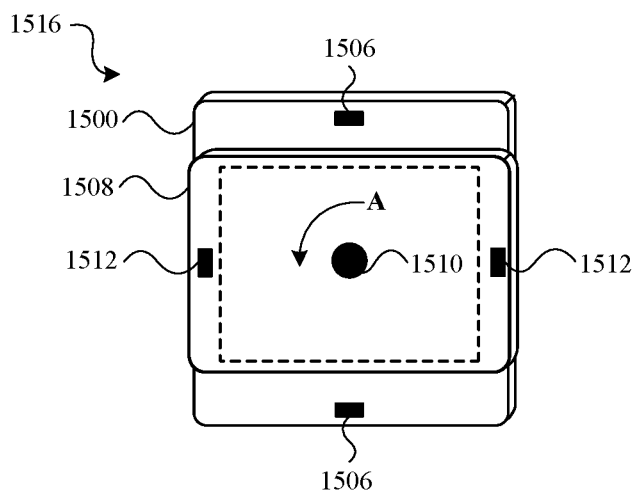

FIGS. 15A-15C depict an example implementation of the integrated magnets and structures with an accessory and a device in accordance with examples of the invention. In FIG. 15A, an attachment accessory 1500 and an electronic device 1508 is shown. The attachment accessory 1500 (e.g., a mount) includes a center integrated magnet 1502 and magnets positioned on the outer perimeter of the accessory 1500, such as magnets 1504 positioned along a horizontal axis with respect to the center magnet 1502, and magnets 1506 positioned along a vertical axis with respect to the center magnet 1502. In some embodiments, the magnets vary in strength (e.g., strength of magnetic field/attraction). For example, the center magnet 1502 may be formed and integrated to produce a stronger magnetic field than magnets 1504 and 1506. The electronic device 1508 also includes a center magnet 1510 and magnets 1512 positioned on the outer perimeter of the device along a vertical axis with respect to the center magnet 1510. The magnets 1510 may be integrated into the device 1508 or adhered external to the device. In some embodiments, the strength of the magnets 1510 and 1512 vary. For example, the center magnet 1502 may be configured to produce a stronger magnetic field than magnets 1510.

As shown in FIG. 15B, the device 1508 may be configured to attach to the attachment accessory 1500 in configuration 1514. The center magnet 1502 may be magnetized to be attractive to center magnet 1510 and the outer magnets 1506 may be magnetized to be attractive to outer magnets 1512. In some embodiments, the center magnets 1510 and 1502 produce stronger magnetic fields than the outer magnets 1506 and 1512, thus making the attraction at the center point of the device 1508 and the accessory 1500 stronger than at the outer perimeter.

This may facilitate simple rotation of the device 1508 with respect to the accessory 1500 to predetermined positions with respect to the accessory as shown in configuration 1516 of FIG. 15C. The device 1500 is rotated about 90 degrees in the direction along line A. The magnetic connection between magnets 1510 and 1502 may remain during rotation while the magnetic coupling between magnets 1506 and 1512 are broken in embodiments where the magnetic connection between the center magnets is stronger than that of the outer perimeter magnets. Thus, the device 1508 may be rotated to magnetically couple magnets 1512 to magnets 1504 of the accessory 1500 (thus, magnets 1512 may also be magnetized to attract to magnets 1504). Other rotation positions, magnetic positioning, strengths, etc. for the accessory 1500 and the device 1508 will be understood by those of skill in the art from the disclosure herein.

Figure 15D:
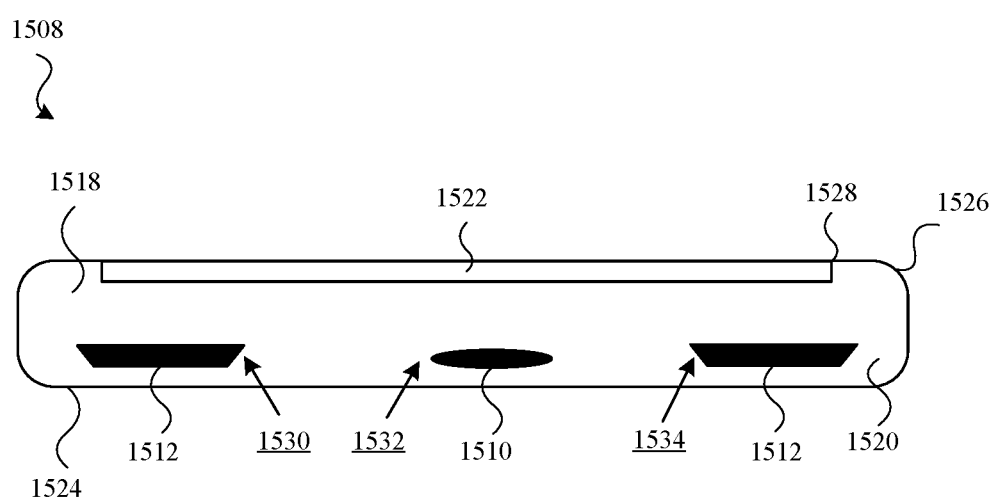
FIG. 15D is a side view of a portable electronic device with embedded magnetic materials/elements.

FIG. 15D is a side view of portable electronic device 1508. The portable electronic device 1508 includes a front (or top) portion 1518 and a back (or rear) portion 1520. The front portion 1518 includes a front opening 1522 that may be adapted for receiving a display (e.g., a touch display) or other device through which a user of the portable electronic device 1508 may interact. The back portion 1520 may include a rear surface 1524 by which a user of the electronic device 1508 may carry the device 1508. Sidewalls 1526 may extend away from the back portion 1520 and may be integrally formed with the front portion 1518, and the sidewalls 1526 may have edges 1528 that define the front opening 1522. Magnetic elements are embedded in the back portion 1520 of the electronic device 1508. Magnetizable materials may be deposited into cavities, recesses, material-receiving portions, etc., 1530, 1532, and 1534 to form magnetic elements, magnetizable elements, layers of magnetizable material, etc., 1510 and 1512 that may be carried by the cavities 1530, 1532, and 1534. Thus, the back portion 1520 may act as the structure/substrates described above when forming, depositing, and shaping the magnetic materials into magnetic elements/permanent magnets. As shown in the previous figures, the magnetizable elements carried by the cavities may be magnetized such that they operate as permanent magnets to form magnetic couplings/attachments with accessory devices, covers, attachments, mounts, and/or other external devices.

Figure 16A:
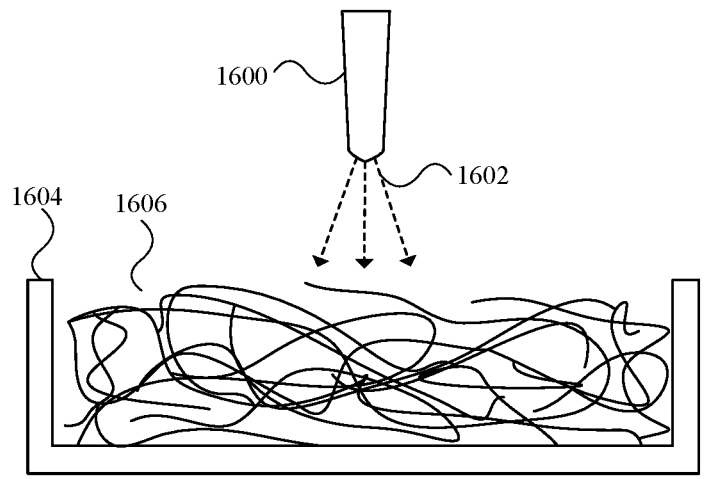
FIGS. 16A and 16B depict deposition of magnetic materials on filler and fabric materials.
Figure 16B:
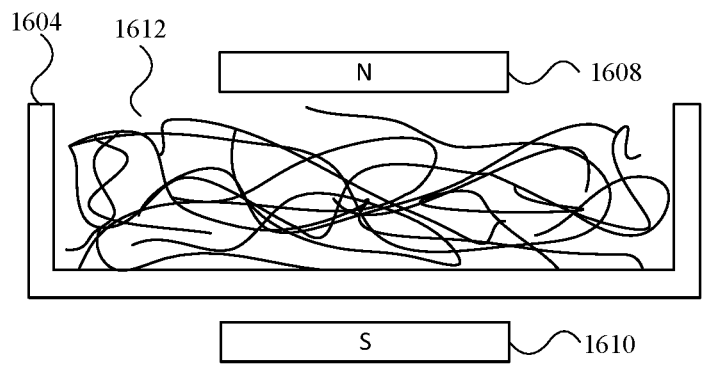
Figure 17:
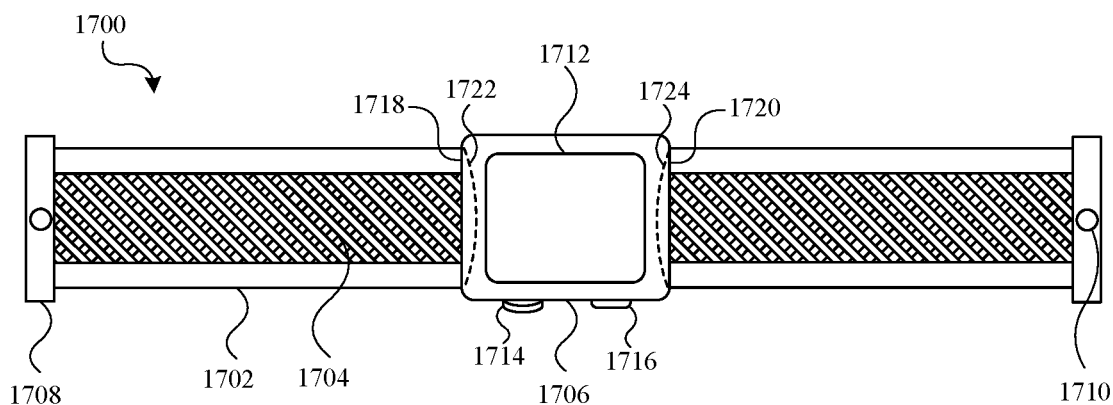
FIG. 17 shows an example device utilizing magnetic filler material.

FIGS. 16A and 16B depict another embodiment of structures configured to receive deposited material according to examples of the invention. In FIG. 16A, a nozzle 1600 is provided to deposit magnetic material 1602 into an area 1604. The area 1604 may be a vat, a container, or other type of area to facilitate the deposition of the material 1602. The area 1604 may include filler 1606, such as fabric material, fibers, woven material, porous material, etc. The filler material 1606 may be constructed to have portions adapted to receive magnetic material such as the material 1602 being deposited. In some embodiments, the filler 1606 is adapted to be impregnated by the magnetic material 1602. In FIG. 16B, the filler material 1612 has been combined with the magnetic material to become magnetic filler material 1612 (e.g., via impregnation, deposition, etc.) and can be magnetized by north pole magnet 1608 and south pole magnet 1610.

The magnetic filler material 1612 may be implemented in various constructions, structures, and embodiments. For example, the magnetic filler material 1612 may be spun into fabric to be used in a wrist band such as the device 1700 shown in FIG. 17. The device 1700 is a wearable device with an electronic component 1706 and a band 1702 including woven portions 1704 constructed of magnetic filler material 1612. The band 1702 may also include an attachment portion 1708 that can be magnetized and configured to attach to portions of the woven portions 1704 via magnetic coupling or to an opposite end of the band 1702 via attachment mechanism 1710 (e.g., a magnet or adhesive). While an electronic component 1706 is shown attached to the device 1700, such a component is not necessary. For example, the band 1702 may be utilized for securing electronics (e.g., portable devices, laptops, etc.) that are not physically attached to the band 1702. Additionally, the device 1700 may also include a display screen 1712 and input mechanisms, such as a rotating wheel input 1714 or button 1716 that are positioned at an edge of the device 1700. The band 1702 may also include a first end portion 1718 that is attached to the device 1700 by coupling portion 1722 in the device, and a second end portion 1720 that is attached to the device 1700 by coupling portion 1724 in the device. Those of skill in the art will recognize other suitable implementations for the magnetic filler material from the disclosure herein.

Figure 18A:
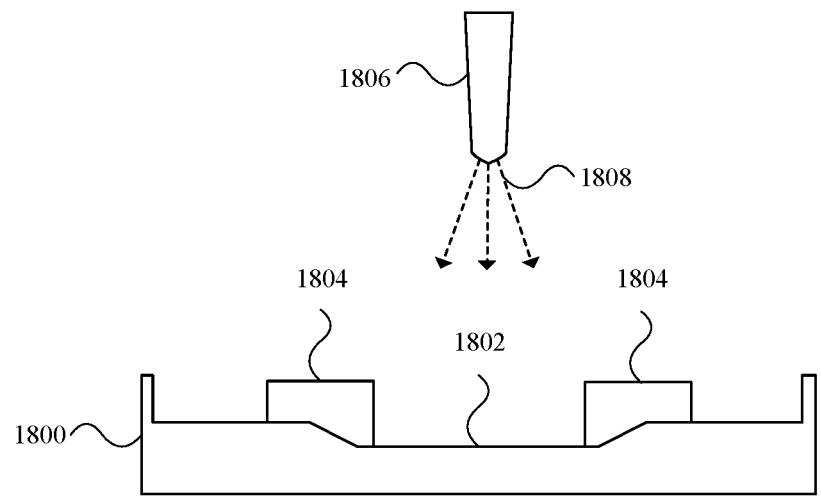
FIGS. 18A, 18B, and 18C are side views of magnetic material deposition on structures with material-receiving portions utilizing masking portions.
Figure 18B:
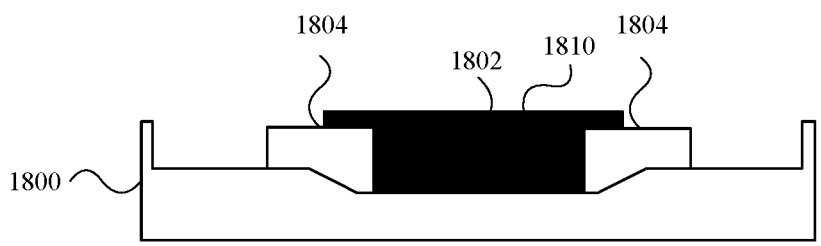
Figure 18C:
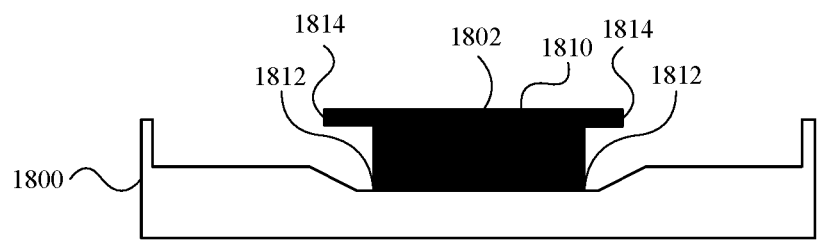

FIGS. 18A-18C show an example embodiment where a material is deposited on a structure utilizing a mask. The embodiment includes a structure 1800 with a material-receiving portion 1802. A nozzle 1806 is positioned above the structure 1800 and is adapted to deposit a material 1808 (e.g., a magnetic material) into the material-receiving portion 1802. The structure 1800 also includes masking portions 1804 partially positioned within the material-receiving portion 1802 and partially outside of the material-receiving portion 1802. Alternative positioning of the masking portions 1804 may be utilized according to a desired shape or construction. When the material 1808 is deposited, it creates a material layer 1810 formed in the material-receiving portion 1802 but outside of the masking portions 1804. The masking 1804 may then be removed (either before or after magnetization) of the material layer 1810. When the masking 1804 is removed, open areas 1812 remain where the masking 1804 was originally positioned, and additional edges 1814 of the material 1810 remain to hang over the open areas 1812. The open areas 1812 and edges 1814 may be configured for securing an external device to the structure 1800 (e.g., an attachment mechanism). By using a masking portion, various shapes, designs, and constructions of magnetic materials may be integrated in the structures.

Figure 19:
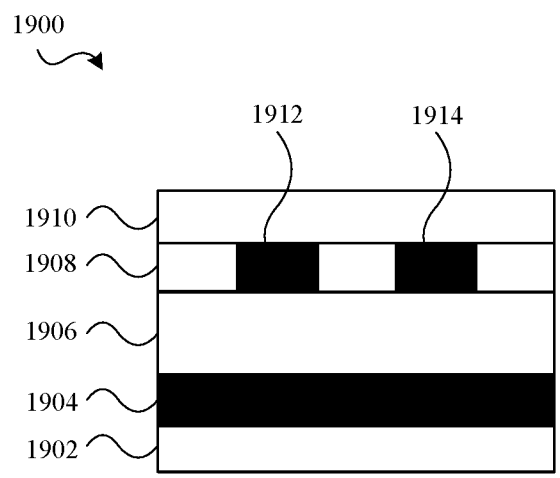
FIG. 19 is a diagram of a stack/arrangement of magnetizable material layers formed by deposition with various magnetic properties.
Figure 20:
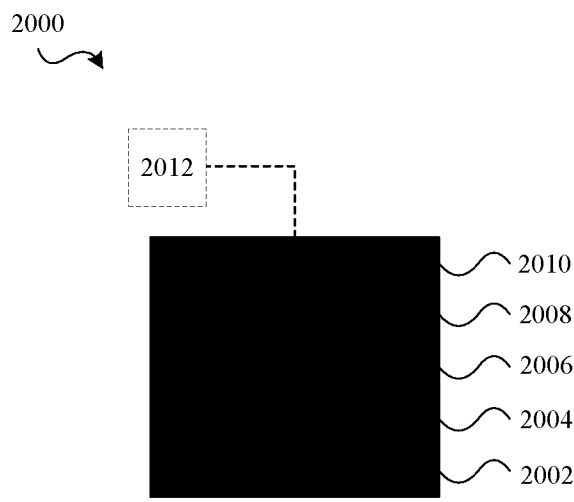
FIG. 20 is a diagram of a stack/arrangement of magnetizable material layers formed by deposition with various magnetic properties coupled to an electromagnetic source.
Figure 21:
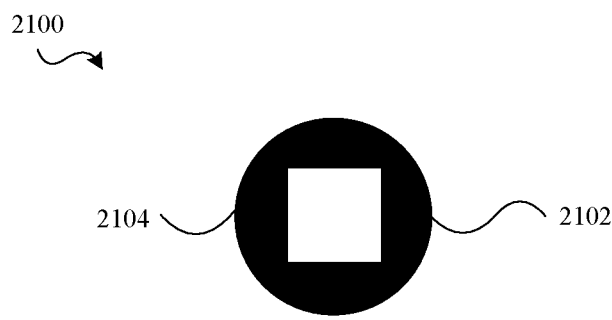
FIG. 21 is a diagram of a magnetic material coated with another material for use in solid-state deposition.

Although structures with material-receiving portions have been described above, other types of magnetic material stacks and arrangements may be constructed as shown in FIGS. 19-21. In FIG. 19, a magnetic stack 1900 is shown that has five layers; layer 1902, layer 1904, layer 1906, layer 1918, and layer 1910. In the example, layer 1902 is a non-magnetic layer, layer 1904 is a magnetic layer, layer 1906 is a non-magnetic layer with a greater thickness than layer 1902, layer 1908 is a generally non-magnetic layer with magnetic portions 1912 and 1914, and layer 1910 is a non-magnetic layer that generally encapsulates portions 1912 and 1914. Alternative stacks and layer sizes may be utilized.

FIG. 20 shows a magnetic stack arrangement 2000. The arrangement includes five layers. The arrangement 2000 may be coupled to an electric source 2012 in the event the embodiment includes an electromagnet. Each of the layers 2002, 2004, 2006, 2008, and 2010 are magnetic layers with varying magnetic strengths. The darker of shading represents a stronger magnetic field generated by the layer.

The layers shown in stacks 1900 and 2000 may be formed of materials constructed for inter-layer adhesion. For example, a magnetic material may be bounded with another material to facilitate adhesion, such as nickel, iron, etc. Thus, layers that include rare or expensive magnetic materials may be combined with other materials such that the layers become ductile with respect to each other, permitting adhesion and vertical construction of magnetic stacks. In some examples, each of the layers in stacks 1900 and 2000 are mono-layers or of near mono-layer thickness, permitting a high degree of customization in the structure and materials used for constructing the stacks 1900 and 2000.

Another example of a magnetic material formation is shown in the arrangement 2100 of FIG. 21. Arrangement 2100 includes an outer structure or portion 2102 that is surrounded by an inner structure or portion 2104. The outer portion 2102 may be formed over the inner portion 2104 by the deposition methods and processes described above. In some embodiments, the inner portion 2104 is formed mainly of a magnetic material while the outer portion 2102 is formed mainly of non-magnetic material or less magnetic material than that of the inner portion 2104. Such material formations may be constructed at the particle size level by coating the inner materials with the outer materials, allowing the formation of materials to be manipulated as larger structures. For example, a plurality of material arrangements 2100 formed at the particle size level may be collected for deposition. The inner portions 2104 may be constructed of a highly magnetic or generally magnetic material that are coated with materials forming the outer portions used for adhesion (e.g., inner portions of neodymium and outer portions of nickel). Thus, after deposition, materials layers formed of such materials may be ductile, allowing for ease of adhesion.

Figure 22A:
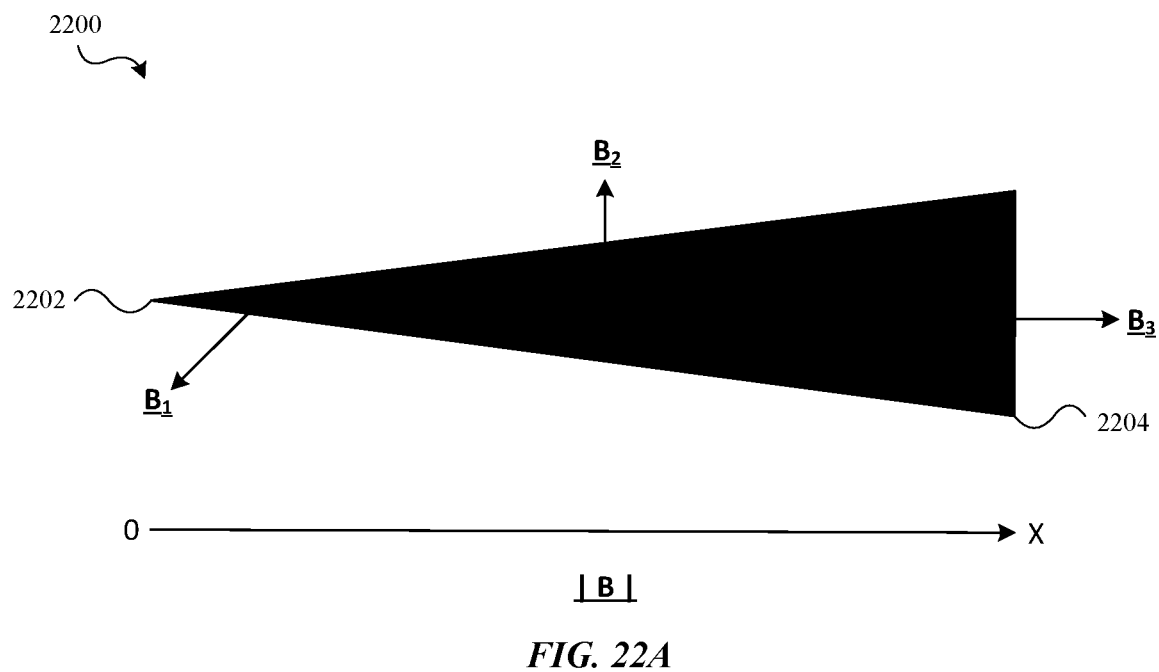
FIG. 22A is a side view of an example magnet formed with varying size, magnetic strength, and magnetic orientation.
Figure 22B:
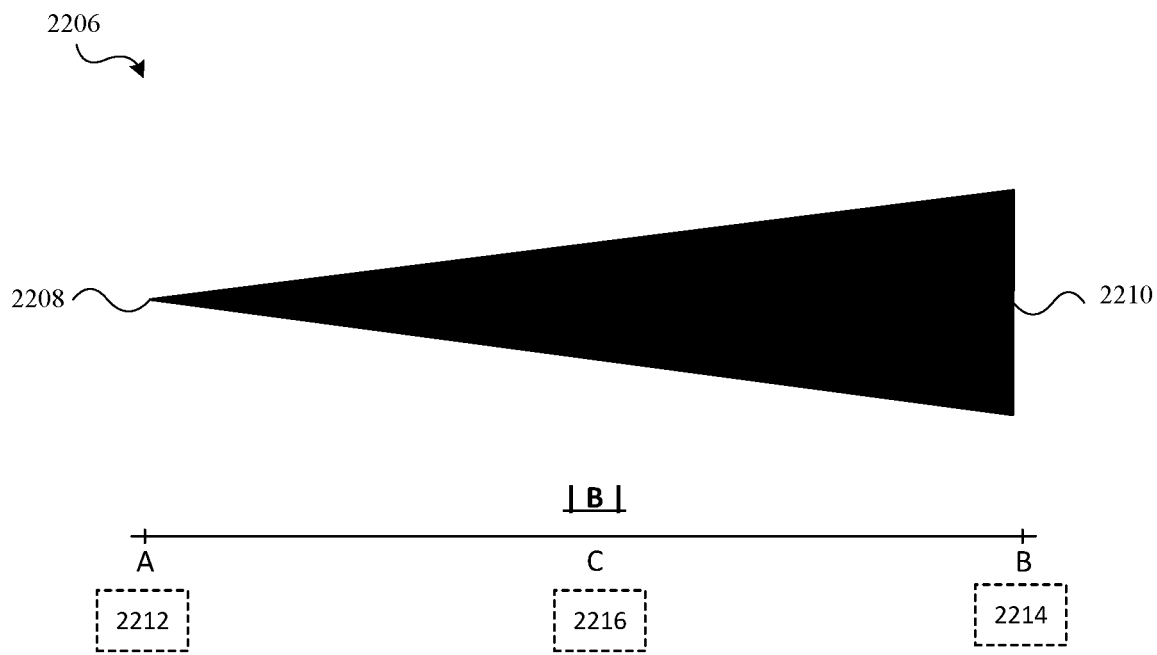
FIG. 22B is a side view of an example magnet formed with an increasing size and constant magnetic field strength.

FIGS. 22A and 22B show other examples of a magnetic material constructed according to examples of the invention. The magnetic structure 2200 of FIG. 22A varies in size, with a smaller radius at one end 2202 and a larger radius at the other end 2204, and having the radius gradually increase in size when progressing from one end 2202 to the other end 2204. In addition, the shading of magnet 2200 represents an increase of magnetic strength/field generated by the magnet 2200 from one end to the other. At the one end 2202, the magnetic field B is low and close to 0. At the other end 2204, the magnetic field B is high and close to the value of x, which may be a predetermined maximum value of magnetic strength to be achieved by the magnet 2200. In addition to varying size and strength, the magnet 2200 has also been magnetized in various orientations, creating magnetic fields of different directions throughout the magnet 2200. For example, the magnet 2200 has been magnetized at the center to generate a magnetic field of strength and direction B2 in the vertical direction. The magnet 2200 has also been magnetized at the other end 2204 to have a strength and direction of B3 in the horizontal direction. The magnet 2200 has also been magnetized near the end 2202 to be magnetized in the strength and direction B1 about 45 degrees from B2 and B3. The magnet 2200 is shown to have a first, second, and third magnetic orientation, although more or less orientations may be implemented. Although the magnet 2200 is shown to have a gradual or tapered distribution of size, strength, etc., the magnet 2200 may be an assembly of discrete portions or partitions, with each portion or partition having its own properties of size, strength, direction, etc. (e.g., additive layers such as those in FIGS. 19 and 20).

In FIG. 22B, the magnetic structure 2206 varies in size, with a smaller radius at one end 2208 and a larger radius at an other end 2210, having the radius gradually increase in size when progressing from the one end 2208 to the other end 2210. The magnetic structure 2206, however, has been formed and magnetized in a particular fashion such that the structure 2206 emulates the behavior of a permanent magnet that has a constant size and a produces a magnetic field of uniform strength and direction. The structure 2206 includes the one end 2208 of smallest radius and the other end 2210 of largest radius. However, a detector 2212 located at position A detects a magnetic field of a strength and direction equal to that detected by detector 2214 located at position B, even though the magnetic structure 2206 is not uniform in size or construction. Further, the detector 2216 at position C may also detect values equal or about equal to that of detector 2212 at position A and detector 2214 at position B. The magnetic structure 2206 may be formed of a gradient of materials such that a stronger or more concentrated material is utilized at end 2208 while a weaker or less concentrated magnetic material is used at end 2210. Then, after geometric formation (or during, as magnetization may occur at any step in the process as is disclosed herein and described above), the magnetic structure 2206 is magnetized in varying directions and strengths to achieve the effect described with respect to detectors 2212, 2214, and 2216. Advantageously, the magnetic structure 2206 can fit in non-uniform or non-symmetric areas or structures that may require generation of a uniform magnetic field. Further, the magnetic structure 2206 may be fully encapsulated in a material that is machined to be a uniform and/or symmetric shape, such that the actual properties of the magnet (size, shape, structure, material, distribution, etc.) remain visibly hidden. Alternative and combinations of magnetic field strengths, orientations, directions, and magnet size may be constructed in accordance with embodiments of the invention.

Figure 23:
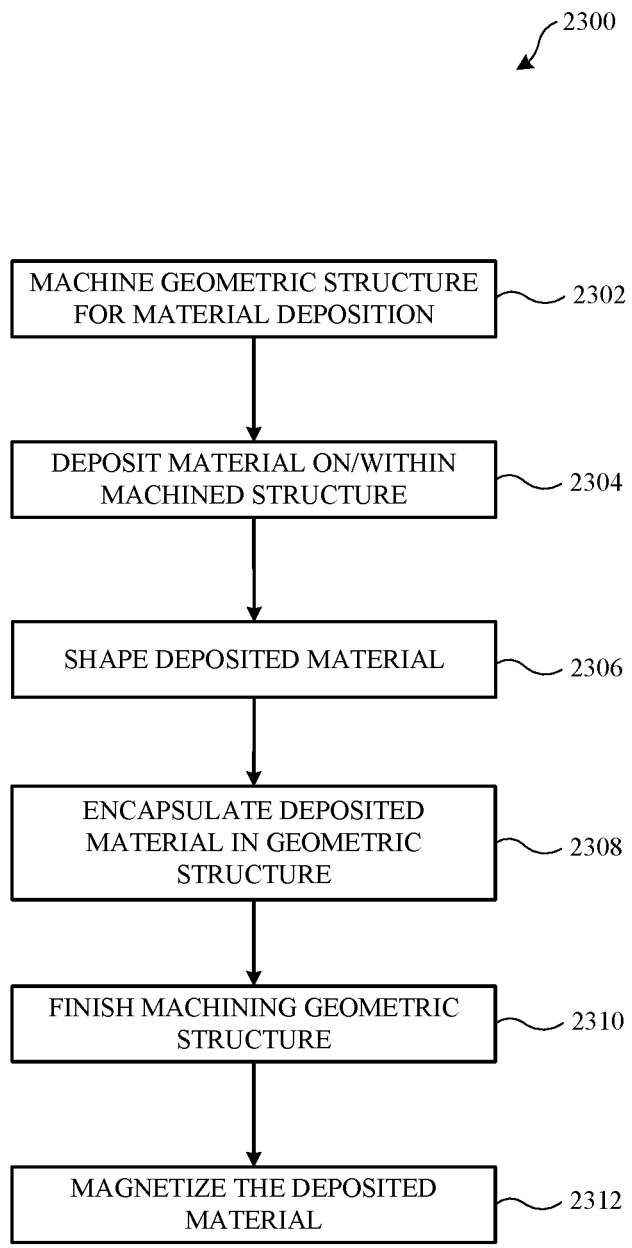
FIG. 23 is a flowchart of steps in an exemplary method of depositing magnetic materials and forming devices with integrated magnets.

FIG. 23 is a flowchart 2300 of steps in a method for deposition and integration of magnetizable materials. At step 2302, a structure (e.g., geometric structure) is formed or machined for material deposition. For example, a structure may be shaped or machined to include a material-receiving portion. At step 2304, magnetizable material is deposited on or within the machined structure formed at step 2302. The magnetizable material may be deposited in the material-receiving portion. The material may be deposited prior to the material being magnetized. The material may be deposited by spray techniques (cold or thermal), growing techniques, and/or other suitable techniques that will be understood to those of skill in the art from the description herein.

At step 2306, the deposited material may be shaped. The material may be shaped during deposition by utilization of an electromagnet to align the magnetizable material being deposited in a desired alignment. The magnetizable material may be shaped after deposition through a machining process as well. At step 2308, the deposited material is encapsulated in the structure. The material may be encapsulated or surrounded by adding additional non-magnetic, magnetic material, material similar to that of which the structure is constructed, or other suitable materials, to the structure.

At step 2310, the machining of the structure is finished. As stated above, an additional material may be positioned to encapsulate the material thereby integrating it. An optional and additional machining step may be performed for additional shaping as desired. At step 2312, the encapsulated or integrated magnetizable material is magnetized. As described, the magnetizable material is magnetized after the finalized shape is formed. However, the material may be magnetized at any point in the process. The material may be magnetized by positioning north and south poles at relative positions to the material to construct the desired strength and direction of the magnetic field generated by the material.

Figure 24:
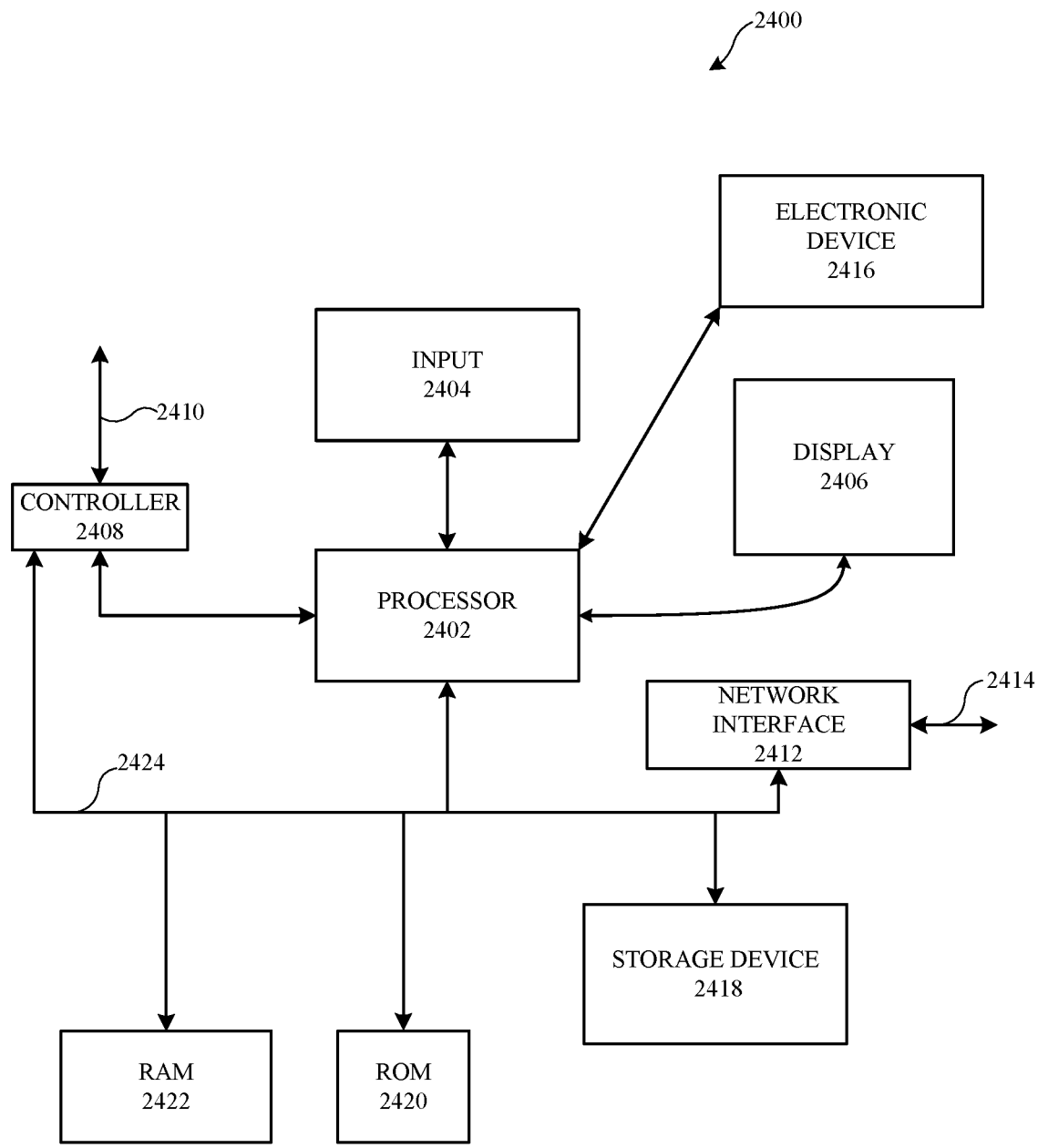
FIG. 24 is an exemplary box diagram of a computer system for implementing the various methods, processes and systems disclosed herein.

FIG. 24 is a block diagram of a computing device 2400 that can use the structures with the magnetic materials and can be used to form the deposited and integrated magnetic materials of the disclosed embodiments. It will be appreciated that the components, devices or elements illustrated in and described with respect to FIG. 24 may not be mandatory and thus some may be omitted in certain embodiments. The computing device 2400 can include a processor 2402 that represents a microprocessor, a coprocessor, circuitry and/or a controller for controlling the overall operation of the computing device 2400. Although illustrated as a single processor, it can be appreciated that the processor 2402 can include a plurality of processors. The plurality of processors can be in operative communication with each other and can be collectively configured to perform one or more functionalities of the computing device 2400 as described herein. In some embodiments, the processor 2402 can be configured to execute instructions that can be stored at the computing device 2400 and/or that can be otherwise accessible to the processor 2402. As such, whether configured by hardware or by a combination of hardware and software, the processor 2402 can be capable of performing operations and actions in accordance with embodiments described herein.

The computing device 2400 can also include a user input device 2408 that allows a user of the computing device 2400 to interact with the computing device 2400. For example, the user input device 2404 can take a variety of forms, such as a button, keypad, dial, touch screen, audio input interface, visual/image capture input interface, input in the form of sensor data, etc. Still further, the computing device 2400 can include a display 2406 (screen display) that can be controlled by the processor 2402 to display information to a user. A controller 2408 can be used to interface with and control different equipment through an equipment control bus 2410. The computing device 2400 can also include a network/bus interface 2412 that couples to a data link 2414. The data link 2414 can allow the computing device 2400 to couple to a host computer or to accessory devices. The data link 2414 can be provided over a wired connection or a wireless connection. In the case of a wireless connection, network/bus interface 2412 can include a wireless transceiver. The computing device 2400 may also include an electronic device 2416 that includes a deposited and integrated magnetic material coupled to the processor 2402.

The computing device 2400 can also include a storage device 2418, and a storage management module that manages one or more partitions (also referred to herein as "logical volumes") within the storage device 2418. In some embodiments, the storage device 2418 can include flash memory, semiconductor (solid state) memory or the like. Still further, the computing device 2400 can include Read-Only Memory (ROM) 2420 and Random Access Memory (RAM) 2422. The ROM 2420 can store programs, code, instructions, utilities or processes to be executed in a non-volatile manner. The RAM 2422 can provide volatile data storage, and store instructions related to components of the storage management module that are configured to carry out the various techniques described herein. The computing device 2400 can further include data bus 2424. The data bus 2424 can facilitate data and signal transfer between at least the processor 2402, the controller 2408, the network/bus interface 2412, the storage device 2418, the ROM 2420, and the RAM 2422. The various aspects, embodiments, implementations or features of the described embodiments can be used separately or in any combination.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
    a housing having a cavity that forms a predefined shape; and
    a magnetizable magnetic element formed of magnetizable particles,
    wherein the magnetizable magnetic element is carried within the cavity such that the magnetizable magnetic element fills the cavity and takes on a size and a shape of the cavity;
    an encapsulating layer that covers the cavity such that the magnetizable particles are enclosed within the housing; and
    a touch display coupled with the housing, the touch display covering the cavity thereby enclosing the magnetizable magnetic element within the housing.

2. The electronic device of claim 1, wherein the magnetizable particles are deposited into the cavity by spray deposition process.

3. The electronic device of claim 1, wherein the magnetizable particles comprise a magnetic property capable of being adjusted in accordance with an applied magnetizing magnetic field.

4. The electronic device of claim 1, wherein the magnetizable particles are coated with filler material.

5. The electronic device of claim 1, wherein the housing is formed of a non-magnetic material.

6. The electronic device of claim 1, wherein the magnetizable magnetic element comprises layers of magnetizable material.

7. The electronic device of claim 1, wherein the magnetizable particles are magnetized such that a magnetic element having a magnetic property is formed, wherein the magnetic element includes a first portion having a magnetic field with a first magnetic property and a second portion having a magnetic field with a second magnetic property.

8. The electronic device of claim 7, wherein the first magnetic property corresponds to a first magnetic polarity and the second magnetic property corresponds to a second magnetic polarity.

9. A method for integrating magnetic particles with a housing of an electronic device, the method comprising:
    filling the magnetic particles in a recess of the housing, wherein the magnetic particles define a magnet that includes a shape corresponding to a predefined shape based on the recess;
    covering the recess with an encapsulating layer that covers such that the magnet is enclosed within the housing; and
    coupling a touch display with the housing, the touch display covering the recess.

10. The method of claim 9, wherein filling the magnetic particles in the recess comprises spraying the magnetic particles in the recess.

11. The method of claim 10, wherein the spraying of the magnetic particles of the magnetizable material includes thermal spraying.

12. The method of claim 11, further comprising:
providing a heat sink that is thermally coupled with the housing; and
drawing, by the heat sink, heat providing by the thermal spraying.

13. The method of claim 9, further comprising using an external magnetic field to align magnetic domains of the magnetic particles while the magnetic particles are being deposited.

14. An electronic device, comprising:
a housing including a recess that forms a predefined shape;
magnetic particles that fill the recess, the magnetic particles defining a magnet that includes a shape corresponding to the predefined shape;
an encapsulating layer that covers the recess such that the magnet is enclosed within the housing; and
a touch display coupled with the housing, the touch display covering the recess.

15. The electronic device of claim 14, wherein the housing further comprises:
a front portion having a front opening;
a back portion; and
sidewalls that extend away from the back portion, the sidewalls integrally formed with the front portion and having edges that define the front opening.

16. The electronic device of claim 14, wherein the magnetic particles comprise a magnetizable material.

17. The electronic device of claim 14, wherein the unitary magnetic particles has a magnetic property that is detectable by a magnetic sensor external to the housing.

18. The electronic device of claim 14, wherein the structure housing includes multiple recesses.

19. The electronic device of claim 14, wherein the housing is non-magnetic and wherein the encapsulating layer is ferromagnetic such that the encapsulating layer acts as a magnetic shunt.

* * * * *